United States Patent
Nakano et al.

(10) Patent No.: US 9,698,349 B2
(45) Date of Patent: Jul. 4, 2017

(54) POLYMER AND SOLAR CELL USING THE SAME

(71) Applicant: Kabushiki Kaisha Toshiba, Minato-ku (JP)

(72) Inventors: Yoshihiko Nakano, Yokohama (JP); Shigehiko Mori, Kawasaki (JP); Takeshi Gotanda, Yokohama (JP); Rumiko Hayase, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/072,772

(22) Filed: Mar. 17, 2016

(65) Prior Publication Data

US 2016/0276593 A1    Sep. 22, 2016

(30) Foreign Application Priority Data

Mar. 20, 2015  (JP) .................. 2015-058639

(51) Int. Cl.
*C08G 75/00* (2006.01)
*H01L 51/00* (2006.01)
*H01L 51/42* (2006.01)

(52) U.S. Cl.
CPC .......... *H01L 51/0036* (2013.01); *C08G 75/00* (2013.01); *H01L 51/0043* (2013.01);
(Continued)

(58) Field of Classification Search
CPC ...... C08G 75/00; C08G 75/02; H01L 51/0036
See application file for complete search history.

(56) References Cited

FOREIGN PATENT DOCUMENTS

| JP | 2011-168747 | 9/2011 |
|---|---|---|
| JP | 2013-213180 | 10/2013 |

(Continued)

OTHER PUBLICATIONS

Seul-Ong Kim et al. "N-Octyl-2,7-dithia-5-azacyclopenta[a]pentalene-4,6-dione-Based Low Band Gap Polymers for Efficient Solar Cells", Macromolecules, vol. 46, 2013, 16 pages.

(Continued)

*Primary Examiner* — Rip A Lee
(74) *Attorney, Agent, or Firm* — Oblon, McClelland, Maier & Neustadt, L.L.P.

(57) ABSTRACT

A polymer of an embodiment includes a recurring unit containing at least one bivalent group selected from among a formula (1), a formula (2), a formula (3), and a formula (4).

(1)

(Continued)

-continued

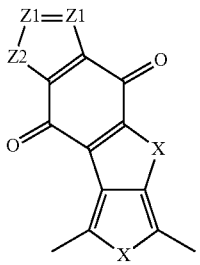

(2)

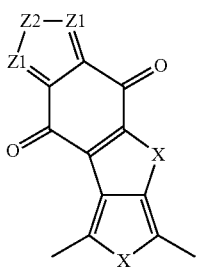

(3)

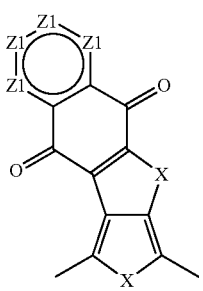

(4)

Z1 indicates carbon having an R1 group, nitrogen, or the like. Z2 indicates oxygen, sulfur, selenium, nitrogen having an R2 group, or the like. The R1 and R2 groups indicate hydrogen, a substituted or unsubstituted alkyl group, a substituted or unsubstituted aryl group, a substituted or unsubstituted heteroaryl group, or the like, X indicates oxygen, sulfur, selenium, or the like.

11 Claims, 1 Drawing Sheet

(52) U.S. Cl.
CPC ..... *C08G 2261/41* (2013.01); *C08G 2261/51* (2013.01); *H01L 51/42* (2013.01); *H01L 51/4253* (2013.01); *Y02E 10/549* (2013.01)

(56) References Cited

FOREIGN PATENT DOCUMENTS

JP            2014-175472         9/2014
WO     WO 2013/066065 A1 *  5/2013    ............. C08G 61/12

OTHER PUBLICATIONS

Mikkel Jorgensen et al. "Stability of Polymer Solar Cells", Advanced Materials, vol. 24, 2012, pp. 580-612.
Jin Hyuck Heo et al. "Efficient Inorganic-Organic Hybrid Heterojunction Solar Cells Containing Perovskite Compound and Polymeric Hole Conductors", Nature Photonics, vol. 7, Jun. 2013, pp. 486-491.

* cited by examiner

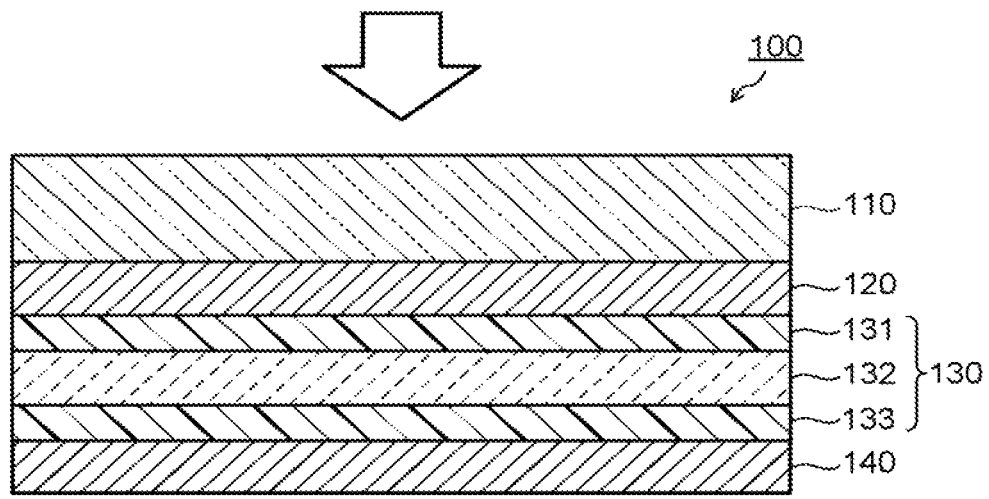

POLYMER AND SOLAR CELL USING THE SAME

CROSS REFERENCE TO RELATED APPLICATION

This application is based upon and claims the benefit of priority from Japanese Patent Application No. 2015-058639, filed on Mar. 20, 2015; the entire contents of which are incorporated herein by reference.

FIELD

Embodiments described herein relate generally to a polymer and a solar cell using the same.

BACKGROUND

An application of an organic semiconductor to a photoelectric conversion element such as a solar cell, a light-emitting element, or a photosensor is expected. In particular, using a high molecular compound as an organic semiconductor material makes it possible to fabricate an active layer by a low-cost coating method. From a viewpoint of energy requirement and an emission reduction of $CO_2$, a solar cell is expected as one of clean energies with a small environmental load, and a demand for this is rapidly increasing. Currently, a silicon-based solar cell is prevailing, but its efficiency is around 15% and it is difficult to reduce its cost. As a solar cell that can be fabricated at low cost, a CdTe solar cell has also been known, but since it uses Cd being a harmful element, it is liable to cause an environmental problem. Under such circumstances, practical use of an organic thin-film solar cell and an organic/inorganic hybrid solar cell as a next-generation solar cell that costs low, has high energy conversion efficiency, and is harmless, is being expected.

For example, there is a strong demand for improving power generation efficiency of the organic thin-film solar cell in order to put the organic thin-film solar cell into practical use. In order to improve the power generation efficiency, improving an open-circuit voltage (Voc) is important. A value of the open-circuit voltage of the organic thin-film solar cell greatly depends on the combination of an electron donor and an electron acceptor, and it is required to optimize materials used for these. It has been known that the open-circuit voltage of the organic thin-film solar cell correlates with a difference between a highest occupied molecular orbital (HOMO) energy level of a p-type material and a lowest unoccupied molecular orbital (LUMO) energy level of an n-type material.

It is thought that, in an organic thin-film solar cell currently under development, fullerenes such as phenyl-$C_{61}$-butyric acid methyl ester (PCBM) are most suitable as the n-type material. As the p-type material, a conjugate high polymer of polythiophene such as poly(3-hexylthiophene-2,5-diyl) (P3HT) is generally used. The open-circuit voltage (Voc) of the organic thin-film solar cell in which PCBM and P3HT are combined is low such as about 0.6 V and is not necessarily satisfactory in view of practical application. It has been reported that by using, as the p-type material, a polymer in which imide is ring-condensed with thiophene, the open-circuit voltage improves up to about 0.85 V, but a further improvement in the open-circuit voltage is required for the purpose of enhancing the practicality of the organic thin-film solar cell. Further, in addition to an improvement in the open-circuit voltage, an improvement in life is required in the organic thin-film solar cell. In order to improve the life, active materials excellent in thermal stability (donor and acceptor) are necessary.

Further, recently, studies of an organic/inorganic hybrid solar cell whose energy conversion efficiency has been improved by using an organic/inorganic mixed perovskite compound and an inorganic perovskite compound for a photoelectric conversion layer are underway. In the organic/inorganic hybrid solar cell, as a hole transport layer, polyarylamine, and 2,2',7,7'-tetrakids(N,N-methoxyphenylamine)-9,9'-spirobifluorene (spiro-OMeTAD) are used, and in order to achieve higher efficiency, dopant agents such as t-butylpyridine (TBP) and lithium bis(trifluorononanesulfonyl)imide (Li-TFSI) are used. However, the TBP is a liquid and the Li-TFSI is a hygroscopic substance, so that due to diffusion and dissipation of the TBP into the photoelectric conversion layer, which are caused by a rise in temperature, and due to water molecule absorption caused by deliquesce of the Li-TFSI, performance degradation occurs. This results in a cause for a decrease in the life of the organic/inorganic hybrid solar cell. There has been also proposed to use, as the hole transport layer, P3HT being a p-type material, but it is not possible to obtain sufficient power generation efficiency in this case.

BRIEF DESCRIPTION OF THE DRAWINGS

The Figure is a cross-sectional view illustrating a configuration of a solar cell of an embodiment.

DETAILED DESCRIPTION

According to one embodiment, there is provided a polymer including a recurring unit containing at least one selected from among a bivalent group represented by the following formula (1), a bivalent group represented by the following formula (2), a bivalent group represented by the following formula (3), and a bivalent group represented by the following formula (4).

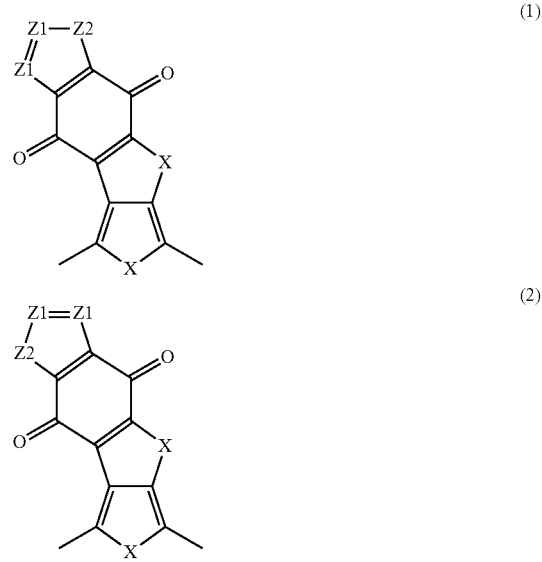

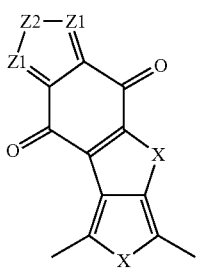

(3)

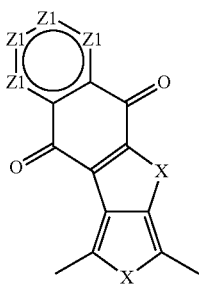

(4)

In the formula (1), the formula (2), the formula (3), and the formula (4), Z1 indicates one selected from carbon having an R1 group and nitrogen, Z2 indicates one selected from among oxygen, sulfur, selenium, nitrogen having an R2 group, and a sulfinyl group, the R1 group indicates a monovalent group selected from among hydrogen, halogen, a cyano group, a nitro group, a substituted or unsubstituted alkyl group, a substituted or unsubstituted alkoxy group, a substituted or unsubstituted alkanoyl group, a substituted or unsubstituted alkylsulfanyl group, a substituted or unsubstituted aryl group, and a substituted or unsubstituted heteroaryl group, the R2 group indicates a monovalent group selected from among hydrogen, a substituted or unsubstituted alkyl group, a substituted or unsubstituted alkanoyl group, a substituted or unsubstituted aryl group, and a substituted or unsubstituted heteroaryl group, and X indicates one selected from among oxygen, sulfur, and selenium.

The polymer of the embodiment is an organic high molecular compound including a recurring unit that contains at least one selected from among the bivalent group represented by the above-described formula (1), the bivalent group represented by the above-described formula (2), the bivalent group represented by the above-described formula (3), and the bivalent group represented by the above-described formula (4). A concrete constitution of the polymer of the embodiment and a solar cell using the polymer of the embodiment will be described below.

[First Polymer]

A first polymer of the embodiment includes at least one selected from among a recurring unit represented by the following formula (1), a recurring unit represented by the following formula (2), a recurring unit represented by the following formula (3), and a recurring unit represented by the following formula (4).

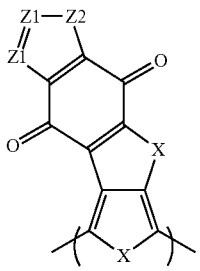

(1)

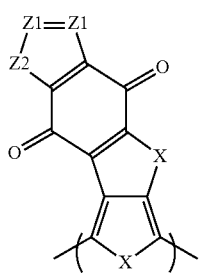

(2)

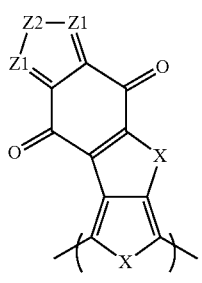

(3)

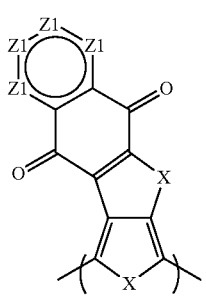

(4)

In the formulas (1) to (4), Z1 indicates one selected from carbon having an R1 group (=CR1-) and nitrogen (=N—). When the recurring unit has 2 or more of Z1, they may be the same or may also be different. Z2 indicates one selected from among oxygen (—O—), sulfur (—S—), selenium (—Se—), nitrogen having an R2 group (—NR2-), and a sulfinyl group (—S(=O)—). The R1 group indicates a monovalent group selected from among hydrogen (H), halogen selected from among fluorine (F), chlorine (Cl), bromine (Br), and iodine (I), a cyano group (—CN), a nitro group (—NO$_2$), a substituted or unsubstituted alkyl group, a substituted or unsubstituted alkoxy group, a substituted or unsubstituted alkanoyl group, a substituted or unsubstituted alkylsulfanyl group, a substituted or unsubstituted aryl group, and a substituted or unsubstituted heteroaryl group. The R2 group indicates a monovalent group selected from among hydrogen (H), a substituted or unsubstituted alkyl group, a substituted or unsubstituted alkanoyl group, a substituted or unsubstituted aryl group, and a substituted or unsubstituted heteroaryl group. X indicates one selected from among oxygen (O), sulfur (S), and selenium (Se).

In the R1 group and the R2 group, a carbon number of the substituted or unsubstituted alkyl group is preferably within a range of 1 to 30. The substituted or unsubstituted alkyl group may be linear, branched-linear, or cyclic. Concrete examples of the alkyl group are a methyl group, an ethyl group, a propyl group, an isopropyl group, a butyl group, a pentyl group, a hexyl group, an octyl group, an isooctyl group, a 2-ethylhexyl group, a nonyl group, a decyl group, a dodecyl group, an octadecyl group, a 2-hexadecyl group, an octadodecyl group, a trifluoromethyl group, a pentafluoroethyl group, a perfluorohexyl group, a perfluorooctyl group, and so on, but the alkyl group is not limited to these.

A carbon number of the substituted or unsubstituted alkoxy group (—OR) is preferably within a range of 1 to 30. The substituted or unsubstituted alkoxy group may be linear, branched-linear, or cyclic. Concrete examples of the alkoxy group are a methoxy group, an ethoxy group, a propoxy group, a butoxy group, a hexyloxy group, an octyloxy group, a 2-ethylhexyloxy group, and so on, but the alkoxy group is not limited to these.

A carbon number of the substituted or unsubstituted alkanoyl group (—C(=O)R) is preferably within a range of 1 to 30. The substituted or unsubstituted alkanoyl group may be linear, branched-linear, or cyclic. Concrete examples of the alkanoyl are an acetyl group, a propanoyl group, a butanoyl group, a pentanoyl group, a hexanoyl group, an octanoyl group, a 2-ethylhexanoyl group, a nonanoyl group, a decanoyl group, a dodecanoyl group, an octadecanoyl group, a 2-hexadecanoyl group, an octadodecyl group, a trifluoroacetyl group, a pentafluoropropanoyl group, a perfluorohexanoyl group, a perfluorooctanoyl group, and so on, but the alkanoyl group is not limited to these.

In the substituted or unsubstituted alkylsulfanyl group (—SR), the alkyl group (R) is the same as an alkyl group in the R1 group and the R2 group, and may be substituted or unsubstituted. Concrete examples of the alkylsulfanyl group are a methylsulfanyl group, an ethylsulfanyl group, a propylsulfanyl group, an isopropylsulfanyl group, a butylsulfanyl group, a hexylsulfanyl group, a heptylsulfanyl group, an octylsulfanyl group, a 2-ethylhexylsulfanyl group, a decylsulfanyl group, a 3,3,3-trifluoropropylsulfanyl group, a 5-methoxypentylsulfanyl group, and so on, but alkylsulfanyl group is not limited to these.

A carbon number of the substituted or unsubstituted aryl group and heteroaryl group is preferably within a range of 4 to 20. Concrete examples of the aryl group and the heteroaryl group are a phenyl group, a naphthyl group, a 4-biphenyl group, a 2-thienyl group, a 2-furanyl group, a 4-tolyl group, a 4-octylphenyl group, a (2-(5-ethylhexyl) thienyl group, a (2-(5-ethylhexyl)furanyl group, and so on, but they are not limited to these.

The polymer of the embodiment has characteristics as a p-type semiconductor material, and is used as a p-type semiconductor material for an active layer and a buffer layer in a photoelectric conversion layer of a solar cell, for example. In the recurring units represented by the formulas (1) to (4), a five-membered heterocycle, a six-membered heterocycle, an aromatic ring, and so on bonded to a benzoquinone ring are excellent in electron-accepting, so that applying such a ring structure makes it possible to fabricate a polymer low in HOMO energy level (p-type semiconductor material). Further, the polymer of the embodiment has excellent heat resistance based on its structure or the like. Therefore, for example, the p-type semiconductor material made of the polymer of the embodiment is combined with an n-type semiconductor material to constitute an active layer, thereby making it possible to improve an open-circuit voltage value, a life, and the like of an organic thin-film solar cell. Further, the p-type semiconductor material made of the polymer of the embodiment is used as a hole extraction layer, thereby making it possible to, while maintaining characteristics of an organic/inorganic hybrid solar cell, improve its heat resistance, life characteristics based on the heat resistance, and the like.

In the polymer of the embodiment, the ring structures bonded to the benzoquinone ring in the recurring units represented by the formulas (1) to (4) (heterocycles and aromatic ring) are further preferably a thiophene ring, a furan ring, a pyrrole ring, a thiazole ring, an isothiazole ring, a pyrazole ring, an imidazole ring, an oxazole ring, an isoxazole ring, a benzene ring, a pyridine ring, a pyrimidine ring, a pyridazine ring, a pyrazine ring, a 1,2,3-triazine ring, a quinoline ring, an indole ring, a benzimidazole ring, a quinazoline ring, a coumarin ring, a phthalazine ring, a naphthalene ring, a chromone ring, and so on. Polymers having these ring structures can effectively reduce the HOMO energy level of the p-type semiconductor material.

A weight-average molecular weight of the polymer containing at least one of the recurring units represented by the formulas (1) to (4) is preferably within a range of 3000 to 1000000. With the polymer having such a weight-average molecular weight, good solubility and semiconductor characteristic can be obtained. The weight-average molecular weight of the polymer is more preferably within a range of 10000 to 600000. The weight-average molecular weight indicates a polystyrene-converted weight-average molecular weight measured by a gel permeation chromatography method. Incidentally, the same is applied also to later-described second to fifth polymers. Further, in order to obtain good solubility, the polymer of the embodiment preferably contains at least one substituted or unsubstituted alkyl group whose carbon number is 6 or more as the R1 group or the like. Incidentally, the same is applied also to later-described second to fifth polymers.

In some case, the recurring units represented by the formulas (1) to (4) by themselves bond in a ring form to constitute the polymer, but the polymer generally contains an end group (Rt group). As the end group Rt, the same monovalent group as the R1 described above is employed. The end group Rt may be a later-described cross-linking group. The first polymer in the embodiment may be constituted only by the recurring units represented by the formulas (1) to (4), or may also contain a recurring unit other than those. However, if the number of moles of the recurring units represented by the formulas (1) to (4) is less than 50 mole %, it is not possible to sufficiently obtain the semiconductor characteristic based on the recurring units represented by the formulas (1) to (4). Therefore, a ratio of the recurring units represented by the formulas (1) to (4) is preferable to be 50 mole % or more to the total number of moles of all the recurring units in the polymer. Incidentally, the same is applied also to later-described second to fifth polymers.

Structure examples of the recurring units represented by the formulas (1) to (4) are given below. However, the recurring unit constituting the first polymer of the embodiment is not limited to the structure examples given below.

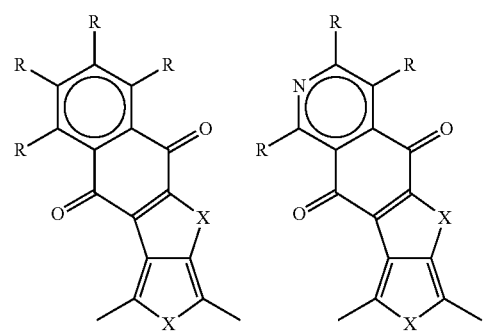

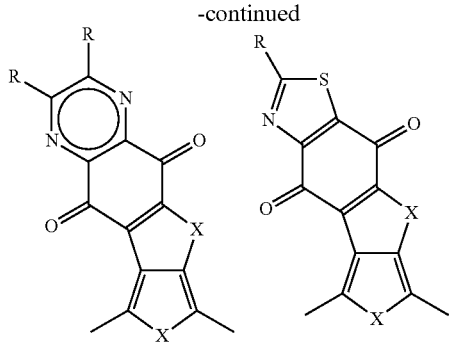
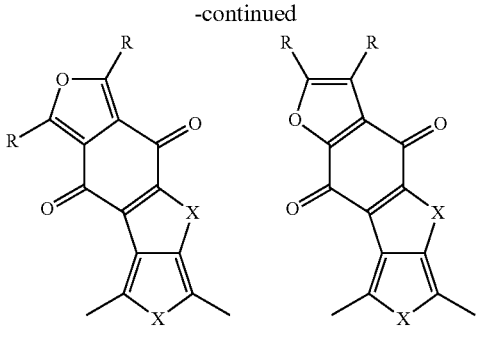
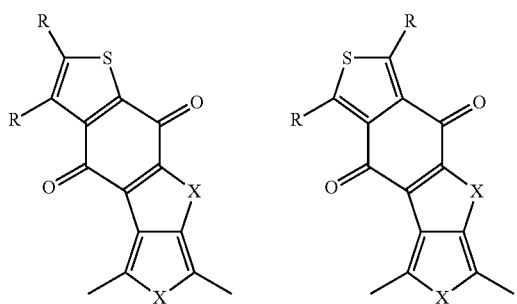
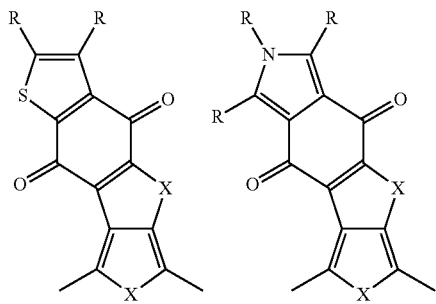

Concrete examples of the recurring units represented by the formulas (1) and (4) are given below. However, the recurring unit constituting the first polymer of the embodiment is not limited to the concrete examples given below. Incidentally, in the chemical formulas given below, Me indicates a methyl group, 2-EH indicates a 2-ethylhexyl group, Hex indicates an n-hexyl group, Oct indicates an octyl group, Hep indicates a heptyl group, HecDec indicates a 2-hexyldecyl group, and OctDod indicates a 2-octyldodecyl group.

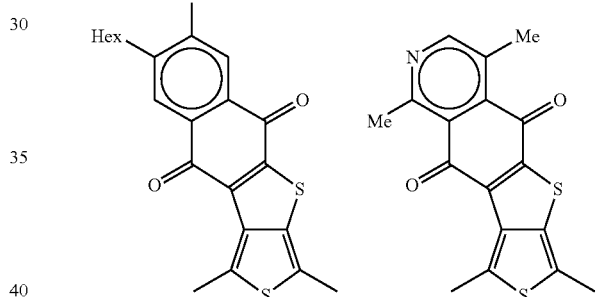
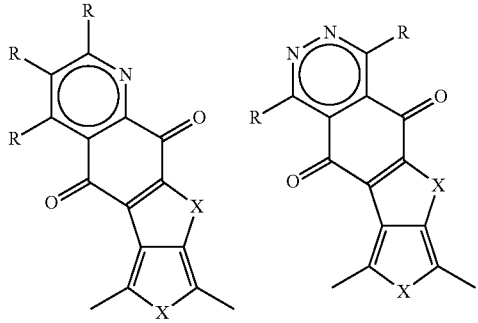
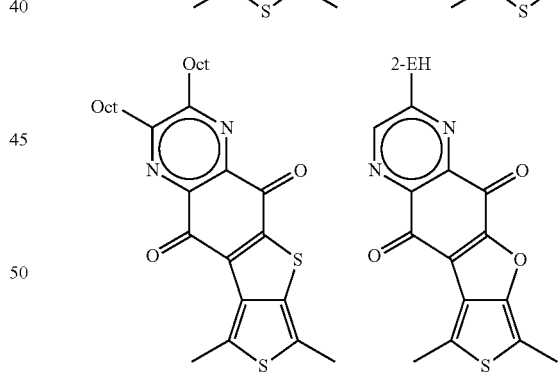
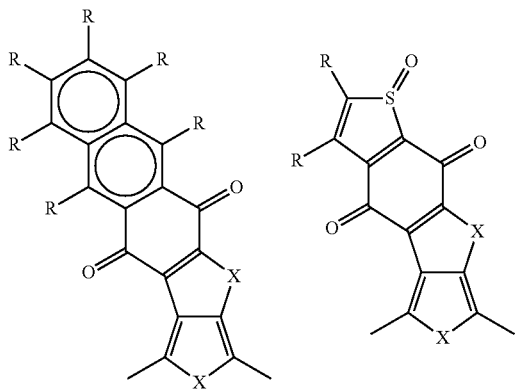
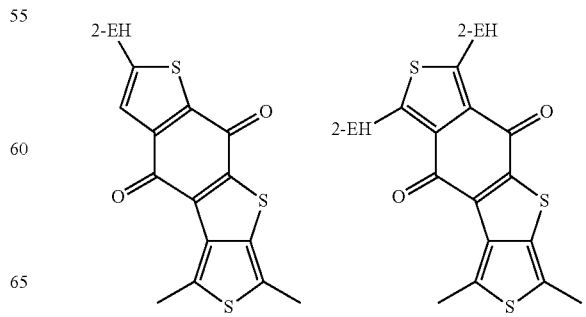

-continued
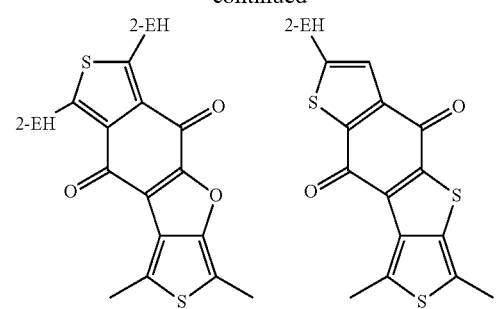
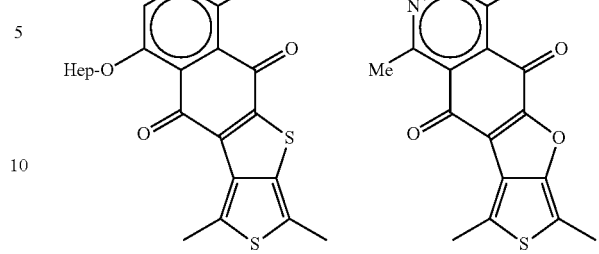
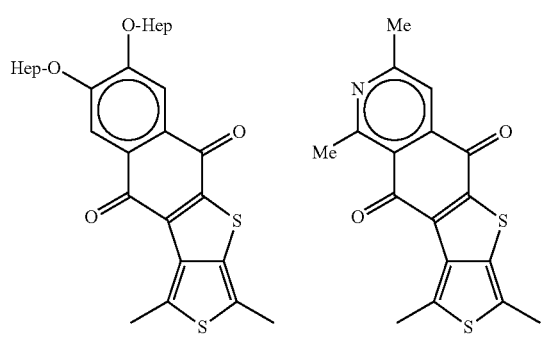
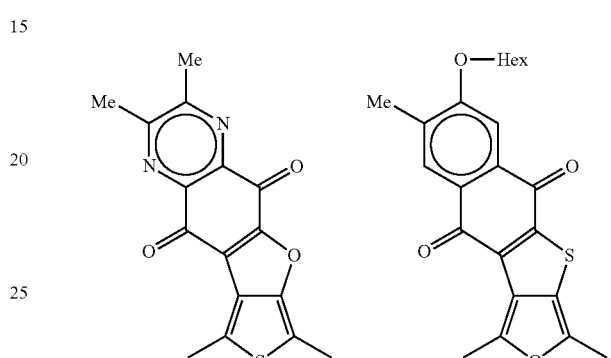
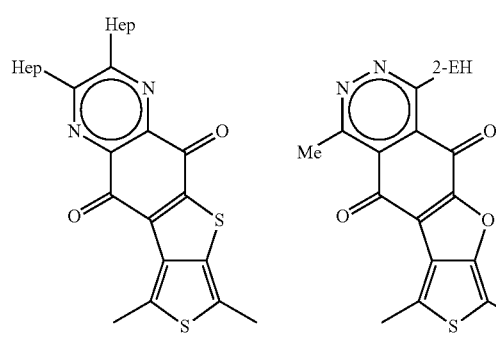
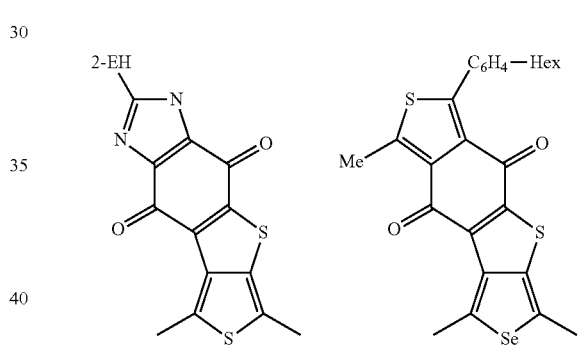
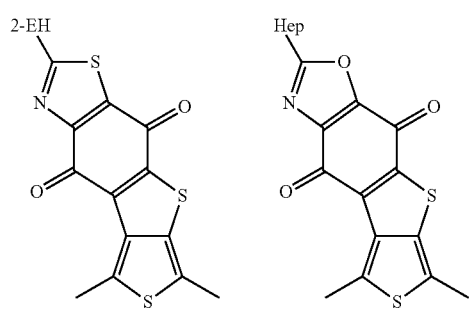
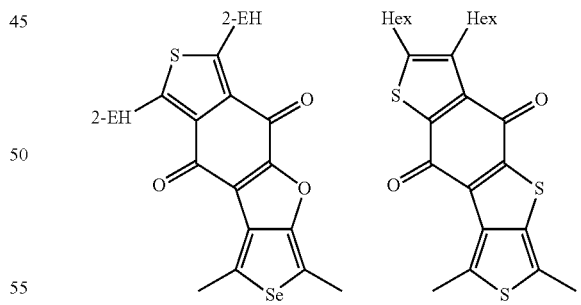
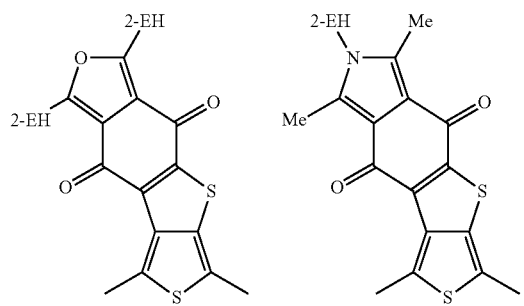
[Second Polymer]
A second polymer in the embodiment includes at least one selected from among a recurring unit represented by the following formula (5), a recurring unit represented by the following formula (6), a recurring unit represented by the following formula (7), and a recurring unit represented by the following formula (8).

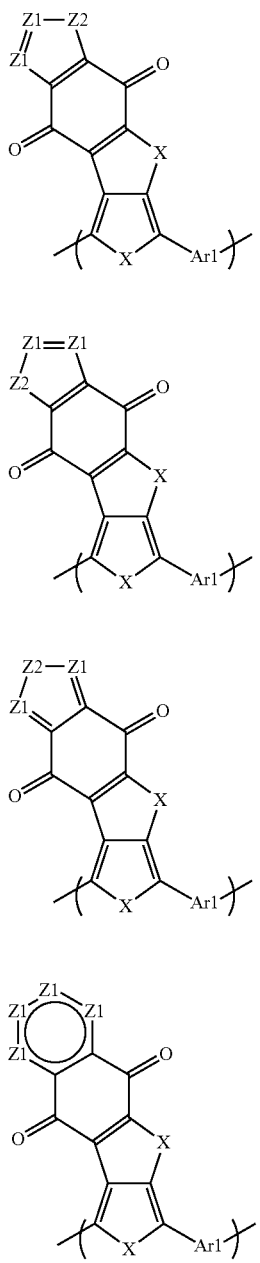

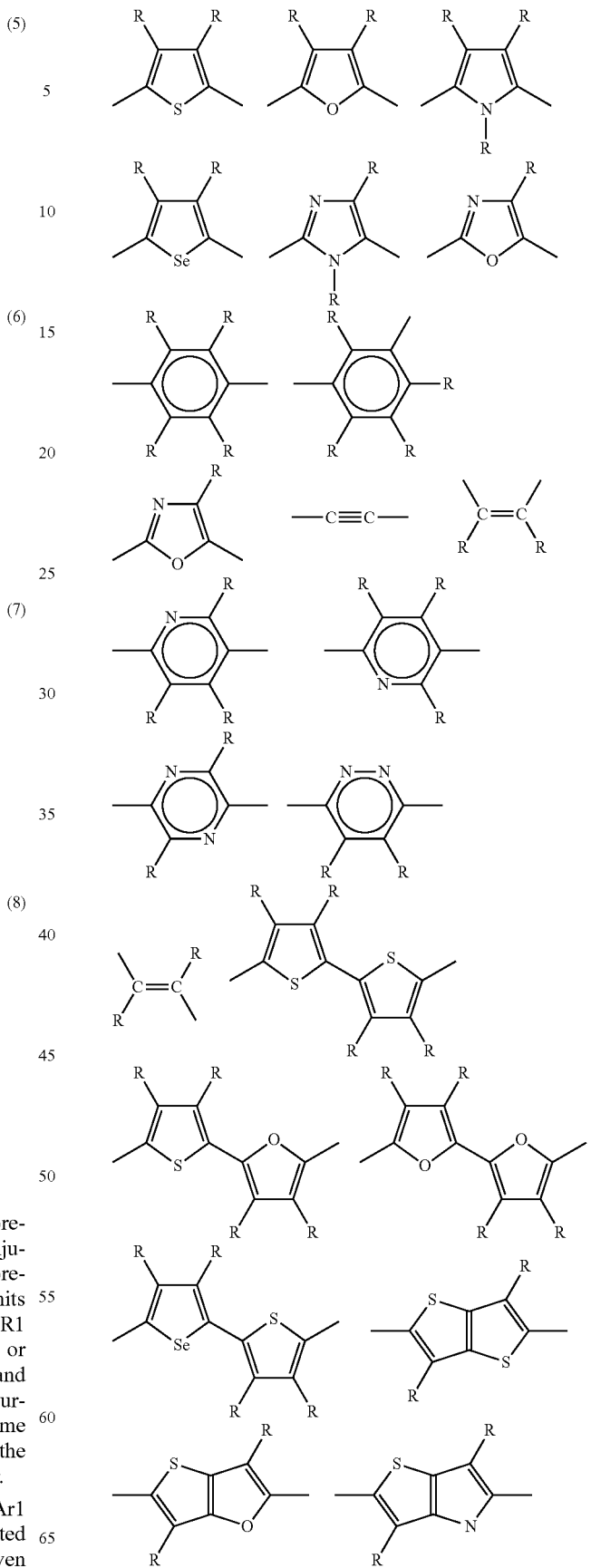

The second polymer including the recurring units represented by the formulas (5) to (8) contains a divalent conjugated group Ar1 in addition to the recurring units represented by the formulas (1) to (4). In the recurring units represented by the formulas (5) to (8), Z1, Z2, X, an R1 group, and an R2 group indicate the same substituents or atoms as those of the formulas (1) to (4) respectively, and concrete examples of these are also the same. In the recurring units represented by the formulas (5) to (8), the same parts as those of the recurring units represented by the formulas (1) to (4) are as explained in the first polymer.

Concrete examples of the divalent conjugated group Ar1 include ones given below. However, the divalent conjugated group Ar1 is not limited to the concrete examples given below.

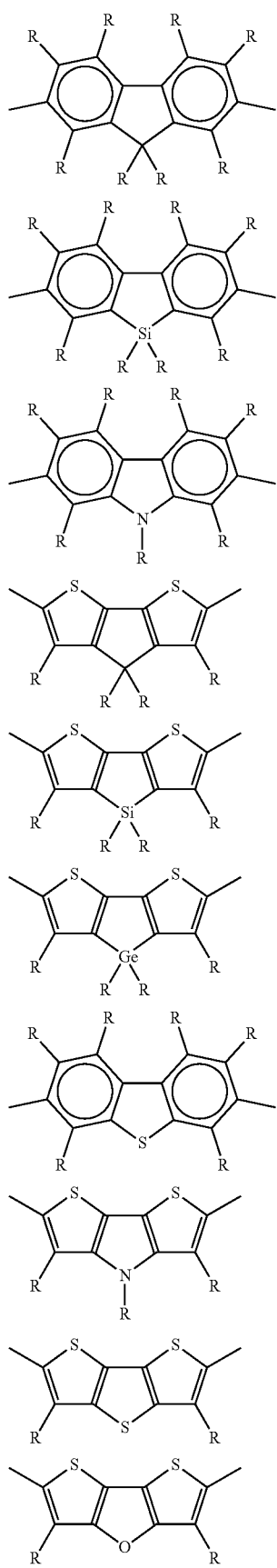
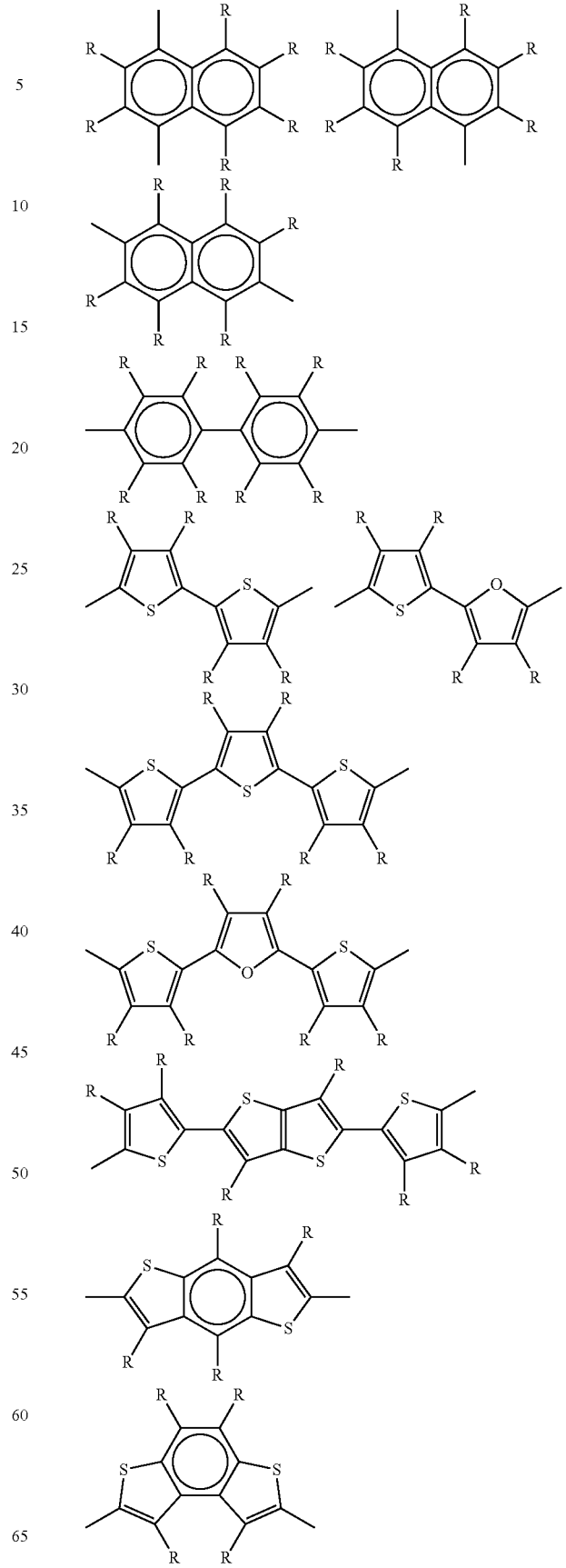

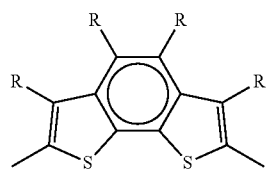
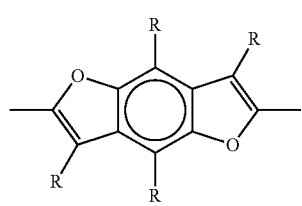
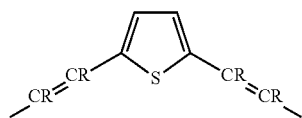
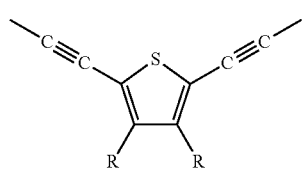
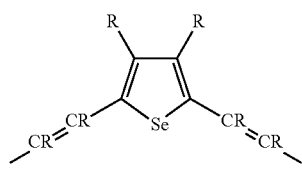
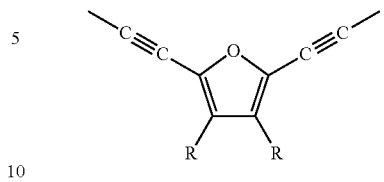
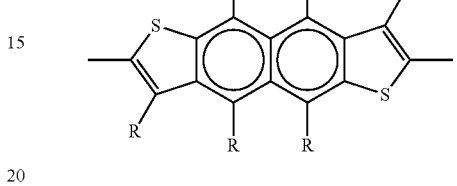
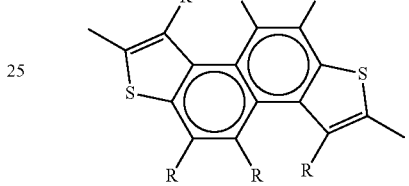
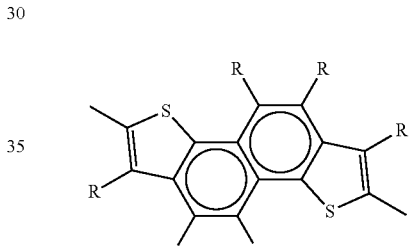
Concrete examples of the recurring units represented by the formulas (5) to (8) are given below. However, the recurring unit constituting the second polymer of the embodiment is not limited to the concrete examples given below.
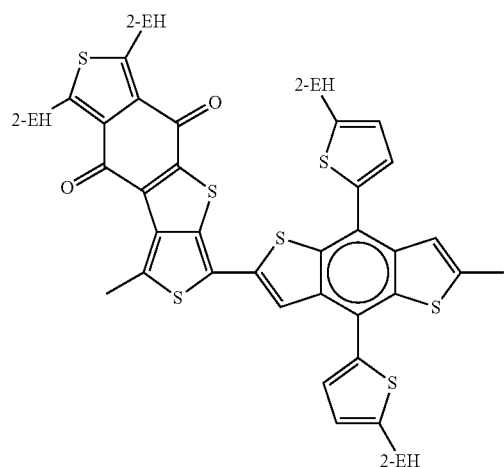
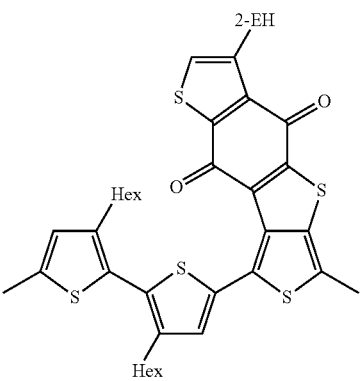

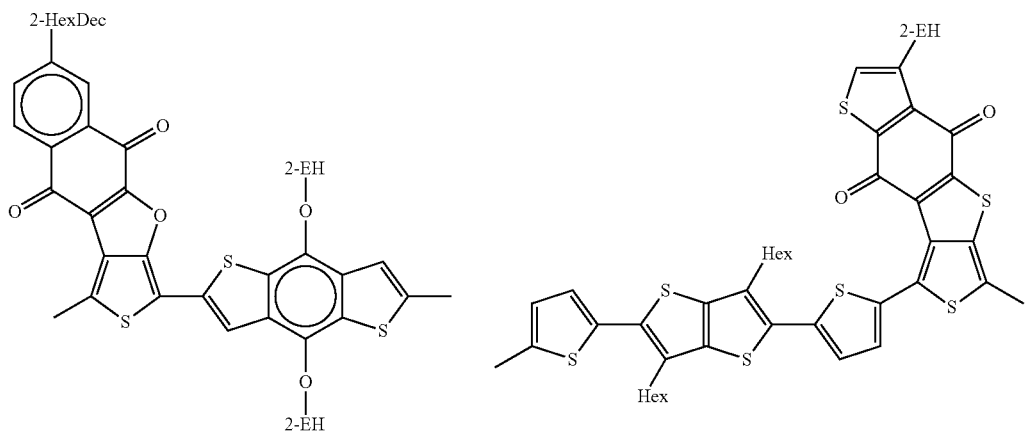
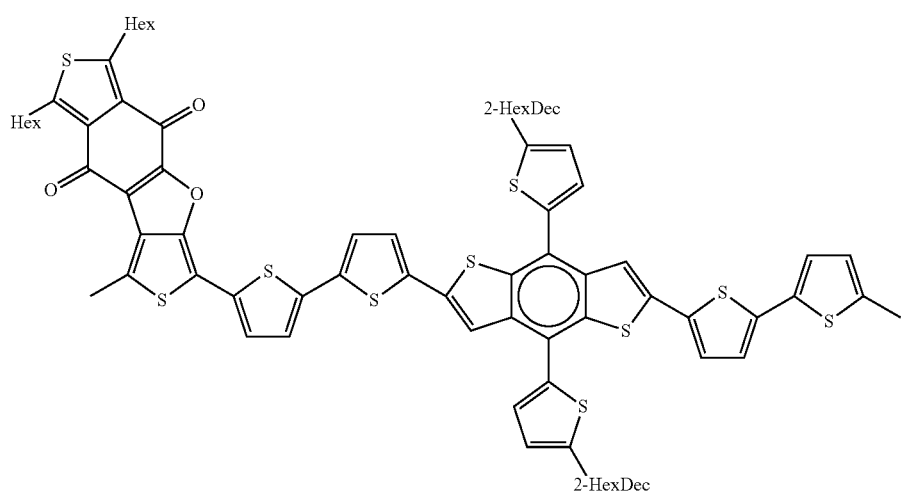
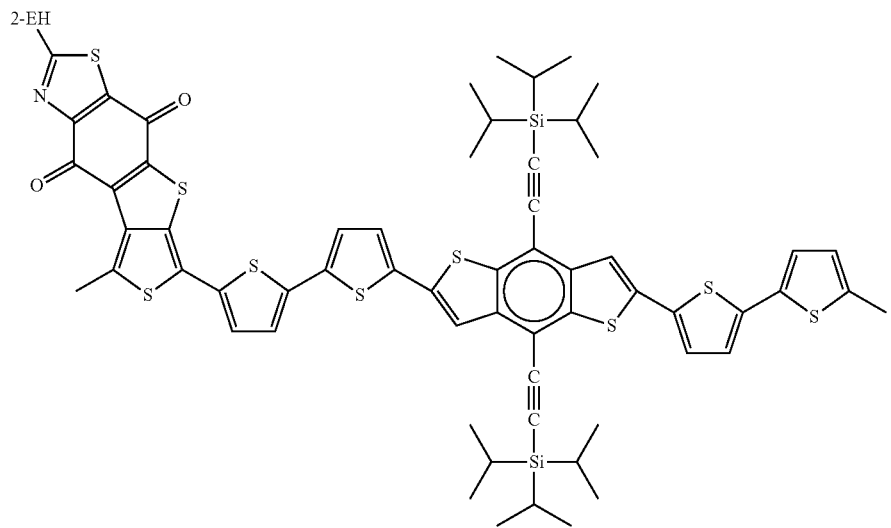

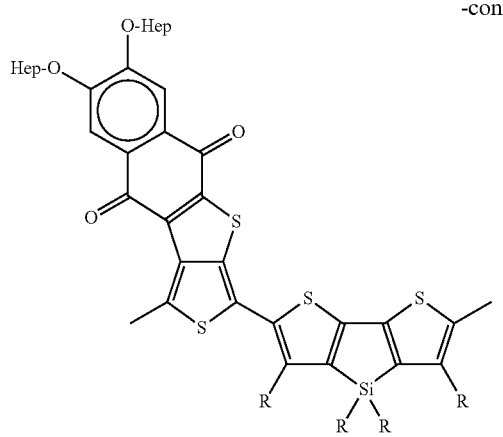
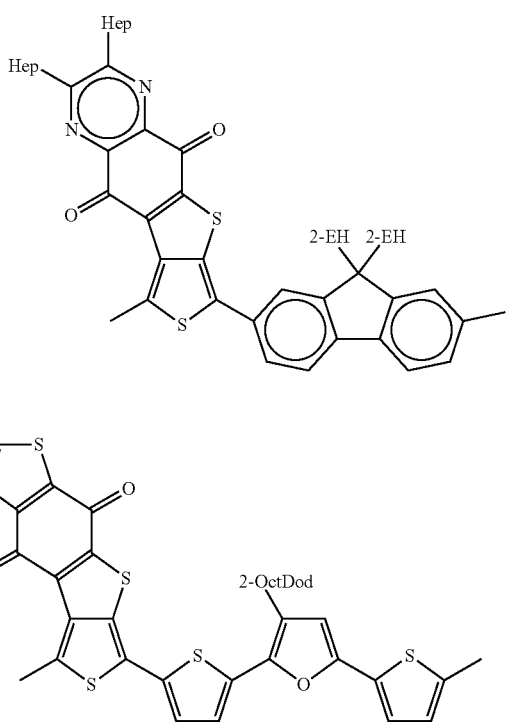

[Third Polymer]

A third polymer in the embodiment includes a structure represented by the following formula (1A), a structure represented by the following formula (2A), a structure represented by the following formula (3A), a structure represented by the following formula (4A), a structure represented by the following formula (5A), a structure represented by the following formula (6A), a structure represented by the following formula (7A), or a structure represented by the following formula (8A).

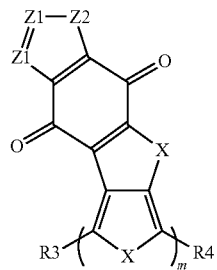

(1A)

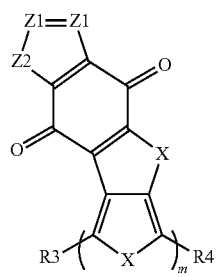

(2A)

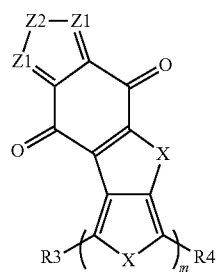

(3A)

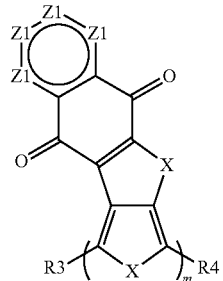

(4A)

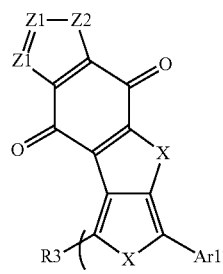

(5A)

-continued

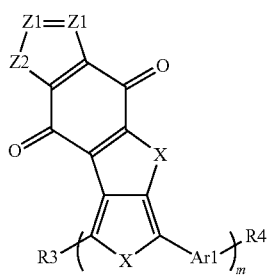
(6A)

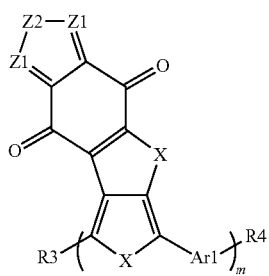
(7A)

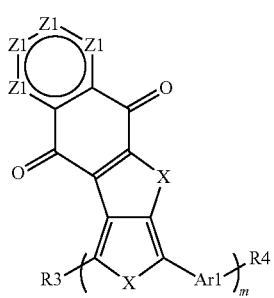
(8A)

The third polymer having the structures represented by the formulas (1A) to (8A) has an R3 group and an R4 group as an end group. At least one of the R3 group and the R4 group has a cross-linking group. In the formulas (1A) to (8A), m indicates a positive number representing the degree of polymerization. The polymer has a cross-linking group, and thereby durability and the like of the polymer can be improved. Incidentally, the R3 group or the R4 group without having a cross-linking group is the same as the R1 group. In the formulas (1A) to (8A), Z1, Z2, X, the R1 group, the R2 group, and the Ar1 group indicate the same substituents or atoms as those in the formulas (1) to (8) respectively, and concrete examples of these are also the same. In the polymer having the structures represented by the formulas (1A) to (8A), the same parts as the recurring units represented by the formulas (1) to (8) are as explained in the first and second polymers.

It suffices that the cross-linking group is a substituent that generates a cross-linking reaction by light, heat, or a radical initiator. For example, as a cross-linking group that generates cross-linking as a result that a bond is decomposed by light, there can be cited a substituent that includes an alkyl group or an alkoxy group where substitution is carried out by bromine or iodine and a substituent that includes an azo group or a diazo group. The cross-linking group may be a substituent that includes a double bond or a triple bond of carbon-carbon that generates photodimerization by light, or a substituent that generates an addition reaction by heat. As such a cross-linking group, an anthranyl group, a cinnamoyl group, a substituent including a coumarin structure, a phenylmaleimide group, a furfurylacrylate group, an acetylene group, benzocyclobutane, a cyclopentadienyl group, and a substituent having a benzocyclobutane or sultine structure are exemplified. Further, the cross-linking group may also be a substituent that includes a multiple bond of carbon-carbon such as an acrylic group or a methacrylic group, as the substituent reacting as a radical initiator. Concrete examples of the polymer having the cross-linking group are given below. The polymer is not limited to the concrete examples given below.

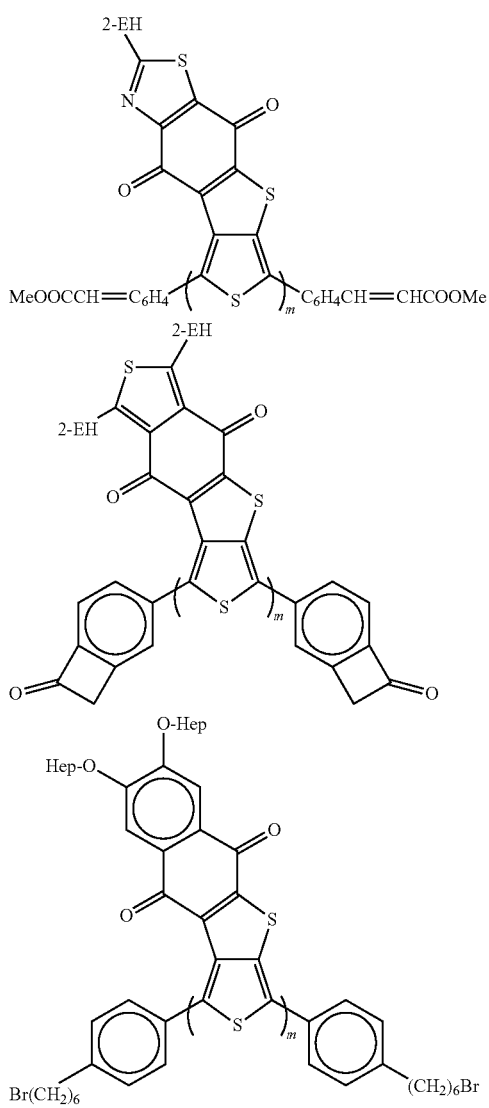

[Forth and Fifth Polymers]

A fourth polymer in the embodiment includes at least one selected from among a recurring unit represented by the following formula (9), a recurring unit represented by the following formula (10), a recurring unit represented by the following formula (11), and a recurring unit represented by the following formula (12).

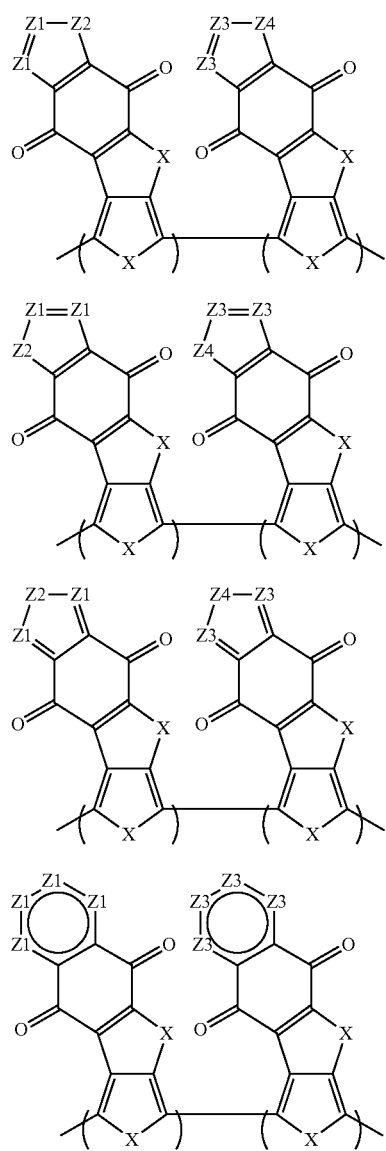

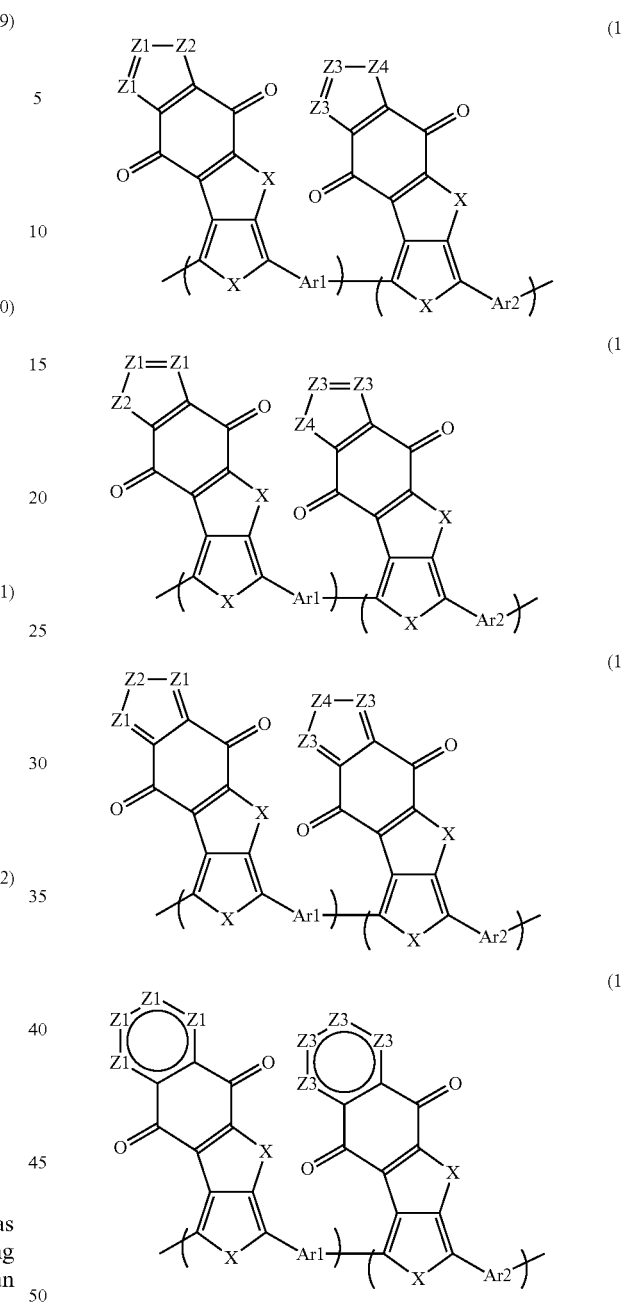

In the formulas (9) to (12), at least one of Z3 and Z4 has a cross-linking group. The polymer has a cross-linking group, and thereby durability and the like of the polymer can be improved. Incidentally, Z3 or Z4 without having a cross-linking group is the same as Z1, and Z2. In the formulas (9) to (12). Z1, Z2, X, the R1 group, and the R2 group indicate the same substituents or atoms as those in the formulas (1) to (4) respectively, and concrete examples of these are also the same. In the recurring units represented by the formulas (9) to (12), the same parts as the recurring units represented by the formulas (1) to (4) are as explained in the first polymer. The cross-linking group is as explained in the third polymer, and concrete examples and the like of the cross-linking group are also the same.

A fifth polymer in the embodiment includes at least one selected from among a recurring unit represented by the following formula (13), a recurring unit represented by the following formula (14), a recurring unit represented by the following formula (15), and a recurring unit represented by the following formula (16).

In the formulas (13) to (16), at least one of Z3, Z4 and the Ar2 group has a cross-linking group. The polymer has a cross-linking group, and thereby durability and the like of the polymer can be improved. Incidentally, Z3, Z4, or Ar2 without having a cross-linking group is the same as Z1, Z2, and Ar1. In the formulas (13) to (16), Z, Z2, X, the R1 group, the R2 group, and the Ar1 group indicate the same substituents or atoms as those in the formulas (1) to (8) respectively, and concrete examples of these are also the same. In the recurring units represented by the formulas (13) to (16), the same parts as the recurring units represented by the formulas (1) to (8) are as explained in the first and second polymers. The cross-linking group is as explained in the third polymer, and concrete examples and the like of the cross-linking group are also the same.

Concrete examples of the polymer having the cross-linking group are given below. However, the fourth and fifth polymers are not limited to the concrete examples given below.

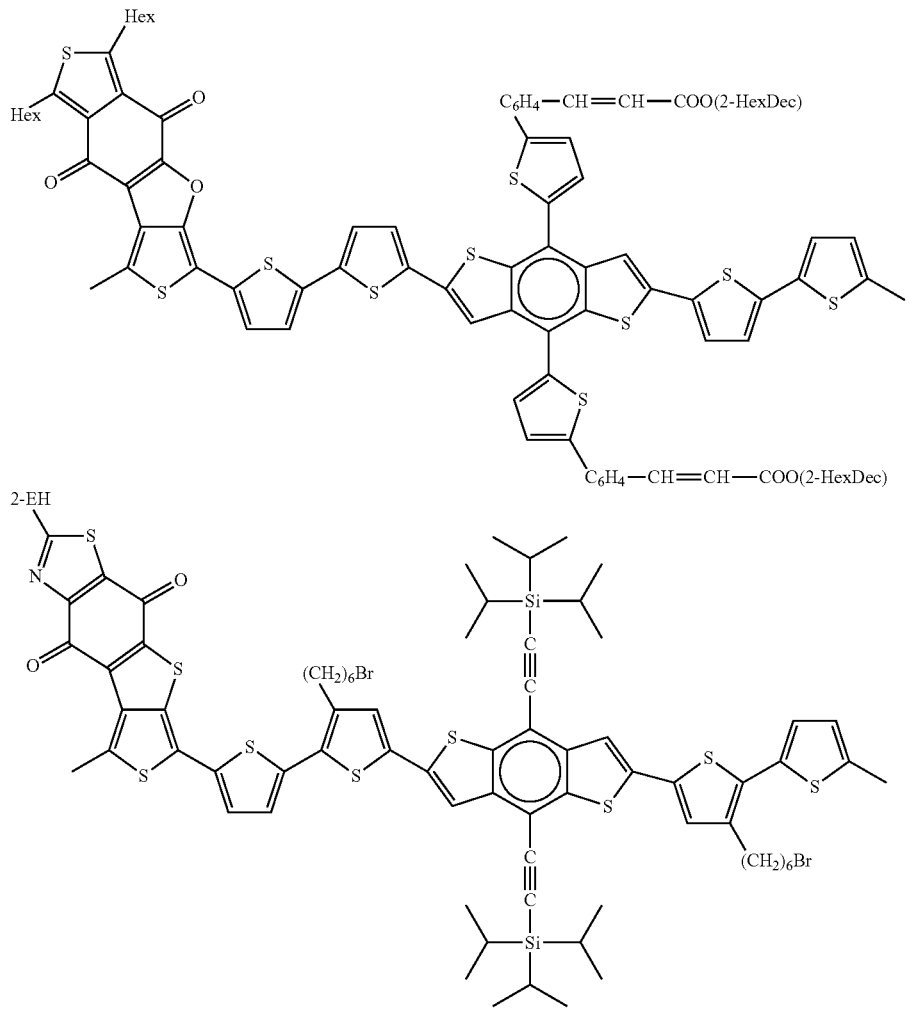

[Method of Synthesizing Organic High Molecule Compound]

A method of synthesizing the polymer of the embodiment is not limited in particular. The polymer of the embodiment can be synthesized as a result that, after a monomer having a functional group suitable for a polymerization reaction to be used is synthesized, for example, the monomer is dissolved in an organic solvent as necessary and polymerized by using a known aryl coupling reaction in which alkali, a catalyst, a ligand, or/and the like is/and used. As a polymerization method by the aryl coupling reaction, there can be cited polymerization methods to which a Stille coupling reaction and a Suzuki coupling reaction are applied, for example.

Polymerization by a Stille coupling is a method in which while a palladium complex being used as a catalyst and a ligand being added as necessary, a monomer that has a trialkyltin residue is made to react with a monomer that has a halogen atom such as a bromine atom, an iodine atom, or a chlorine atom. As the palladium complex, there can be cited palladium[tetrakis(triphenylphosphine)], [tris(dibenzylideneacetone)]dipalladium, palladiumacetate, and bis(triphenylphosphine)palladiumdichloride, for example. Details of polymerization by the Stille coupling reaction is described in International Publication No. 2010/008672. As the solvent used in the Stille coupling reaction, an organic solvent such as, for example, toluene, xylene, N,N-dimethylacetamide, N,N-dimethylformamide, or a mixed solvent made by mixing two or more kinds of the above is used. However, the solvent used in the Stille coupling reaction is not limited to these solvents. In order to suppress a side reaction, the solvent used in the Stille coupling reaction is preferably subjected to a deoxidization processing before a reaction.

Polymerization by a Suzuki coupling reaction is a method in which, under existence of an inorganic base or an organic base, while a palladium complex or a nickel complex being used as a catalyst and a ligand being added as necessary, a monomer that has a boronic acid residue or a boric acid ester residue is made to react with a monomer that has a halogen atom such as a bromine atom, an iodine atom, or a chlorine atom, or a monomer that has a sulfonate group such as a trifluoromethanesulfonate group or a p-toluenesulfonate group.

As the inorganic base, there can be cited a sodium carbonate, a potassium carbonate, a cesium carbonate, a tripotassium phosphate, and a potassium fluoride, for example. As the organic base, there can be cited a tetrabutylammonium fluoride, a tetrabutylammonium chloride, a tetrabutylammonium bromide, and a tetraethylammonium hydroxide, for example. As the palladium complex, there can be cited palladium[tetrakis(triphenylphosphine)], [tris (dibenzylideneacetone)]dipalladium, palladiumacetate, and bis(triphenylphosphine)palladiumdichloride, for example. As the nickel complex, for example, bis(cyclooctadiene) nickel can be cited. As the ligand, there can be cited triphenylphosphine, tri(2-methylphenyl)phosphine, tri(2-methoxyphenyl)phosphine, diphenylphosphinopropane, tri (cyclohexyl)phosphine, and tri(tert-butyl)phosphine, for example. Details of polymerization by the Suzuki coupling reaction is described in Journal of Polymer Science: Part A: Polymer Chemistry, Vol. 39, p 1533-1, 2001, for example.

In polymerization by the aryl coupling reaction, a normal solvent is used. It suffices that the solvent is selected in consideration of a polymerization reaction to be used and solubilities of a monomer and a polymer. Concretely, there can be cited an organic solvent such as tetrahydrofuran, toluene, 1,4-dioxane, dimethoxyethane, N,N-dimethylacetamide, N,N-dimethylformamide, or a mixed solvent made by mixing two or more kinds of the above, and a solvent having two phases of an organic solvent phase and an aqueous phase. In the Suzuki coupling reaction, it is preferable to use an organic solvent such as tetrahydrofuran, toluene, 1,4-dioxane, dimethoxyethane, N,N-dimethylacetamide, N,N-dimethylformamide, or a mixed solvent made by mixing two or more kinds of the above, or a solvent having two phases of an organic solvent phase and an aqueous phase. In order to suppress a side reaction, the solvent used in the Suzuki coupling reaction is preferably subjected to a deoxidization processing before a reaction.

A reaction temperature of the aryl coupling reaction is preferable to be −100° C. or more in view of reactivity, more preferable to be −20° C. or more, and particularly preferable to be 0° C. or more. The reaction temperature is preferable to be 200° C. or less in view of stability of a monomer and a high molecular compound, more preferable to be 150° C. or less, and particularly preferable to be 120° C. or less. In polymerization by the aryl coupling reaction, a known method can be applied to extraction of a polymer from a reaction solution after the reaction. For example, the polymer of the embodiment can be obtained as a result that a reaction solution is added to a lower alcohol such as methanol, a precipitated deposit is filtered, and a filtered material is dried. When purity of the obtained polymer is low, the polymer may be refined by recrystallization, continuous extraction by a Soxhlet extractor, column chromatography, or the like.

The polymer of the embodiment can be synthesized by using the Stille coupling reaction. The polymer is synthesized by polymerizing dihalogen compounds represented by formulas (17) to (20) and bis(trialkyl)tin represented by a formula (21), for example. In the following formulas, Z1, Z2, X, and Ar1 are as described above, and Y indicates a halogen atom such as chlorine, bromine, or iodine.

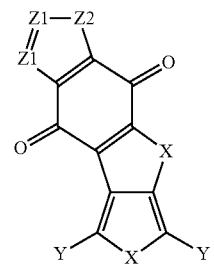

(17)

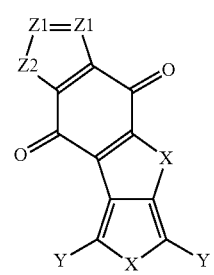

(18)

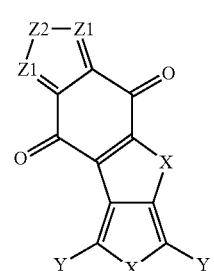

(19)

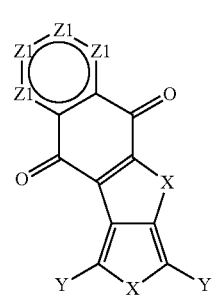

(20)

(21)

Structure examples of the compounds represented by the formulas (17) to (20) are given below. However, the compounds are not limited to the structure examples below. In the following formulas, R indicates hydrogen, halogen, a cyano group, a nitro group, a substituted or unsubstituted alkyl group, a substituted or unsubstituted alkoxy group, a substituted or unsubstituted alkanoyl group, a substituted or unsubstituted alkylsulfanyl group, a substituted or unsubstituted aryl group, and a a substituted or unsubstituted heteroaryl group.

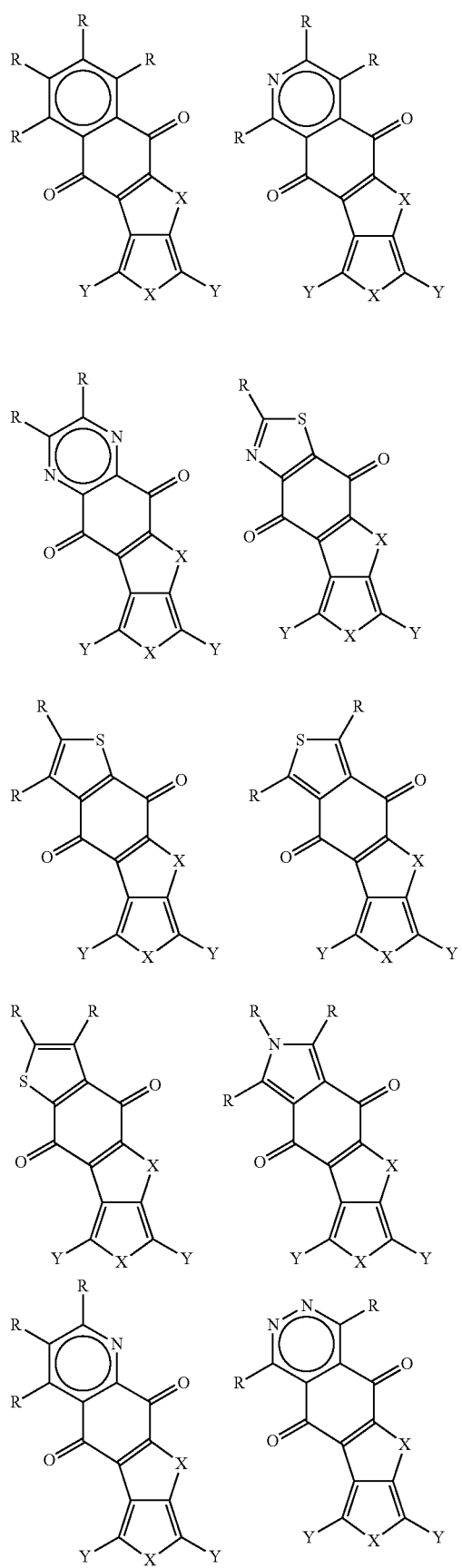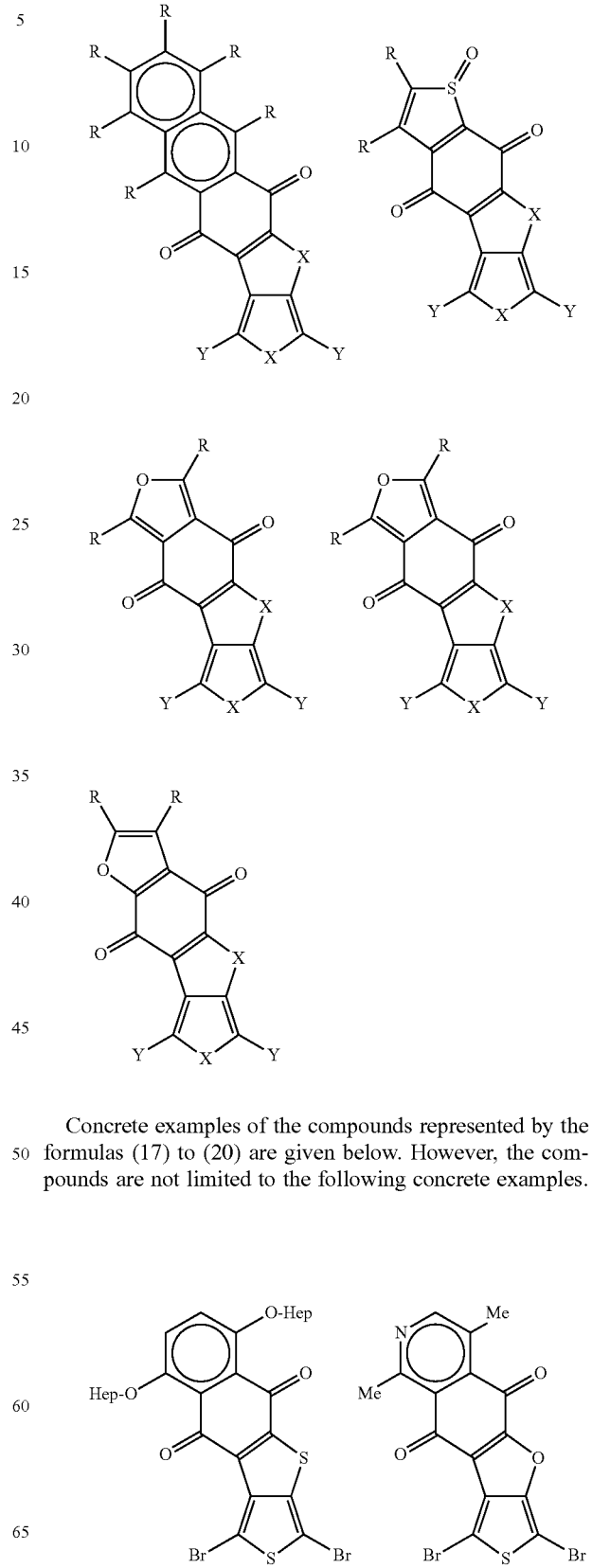
Concrete examples of the compounds represented by the formulas (17) to (20) are given below. However, the compounds are not limited to the following concrete examples.
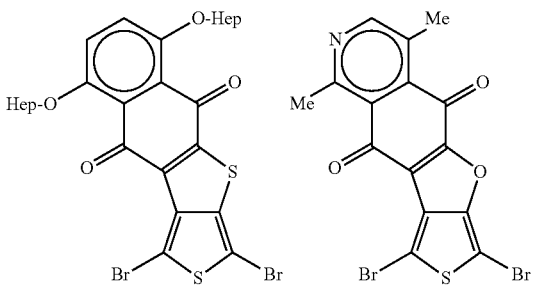

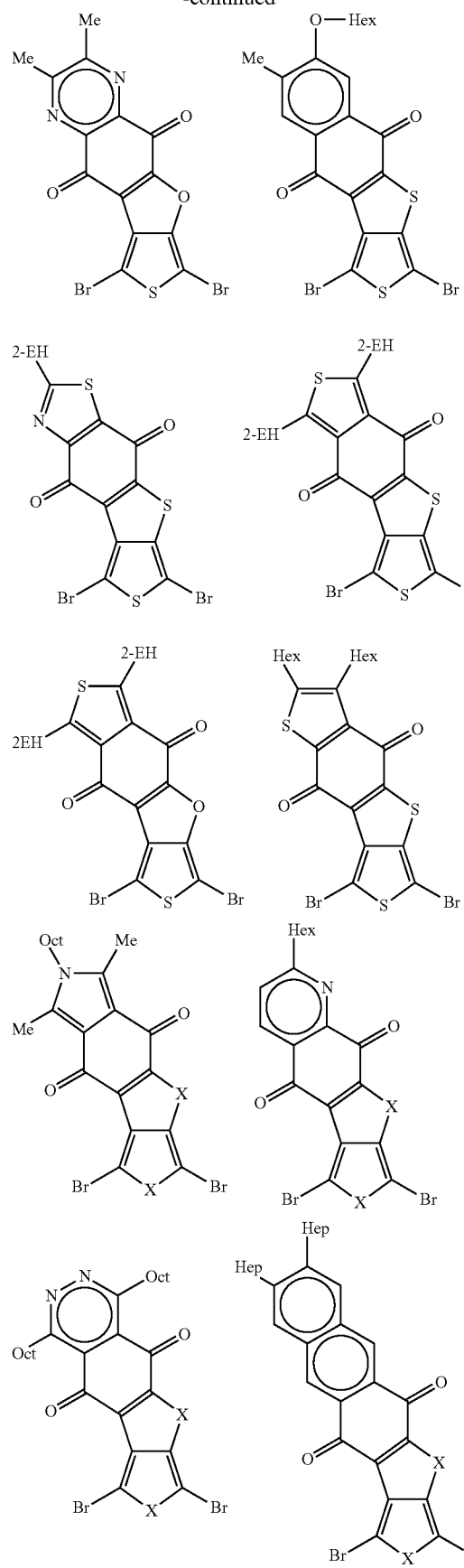
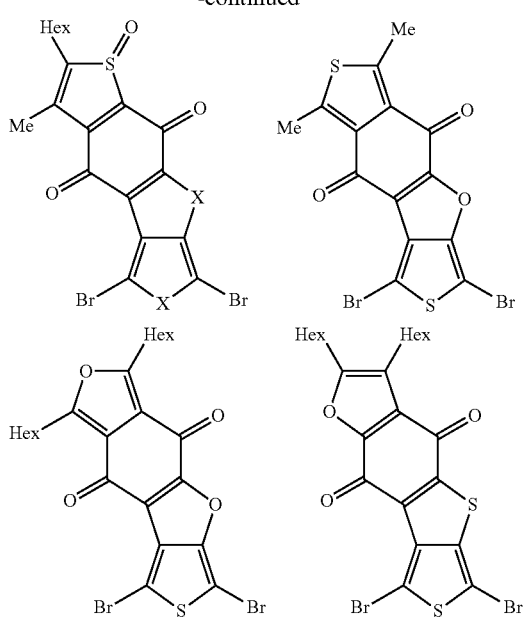
Structure examples of the compound represented by the formula (21) are given below. However, the compound is not limited to the following structure examples. In the following formulas, R' indicates an alkyl group such as a methyl group, an ethyl group, a butyl group, or an octyl group.
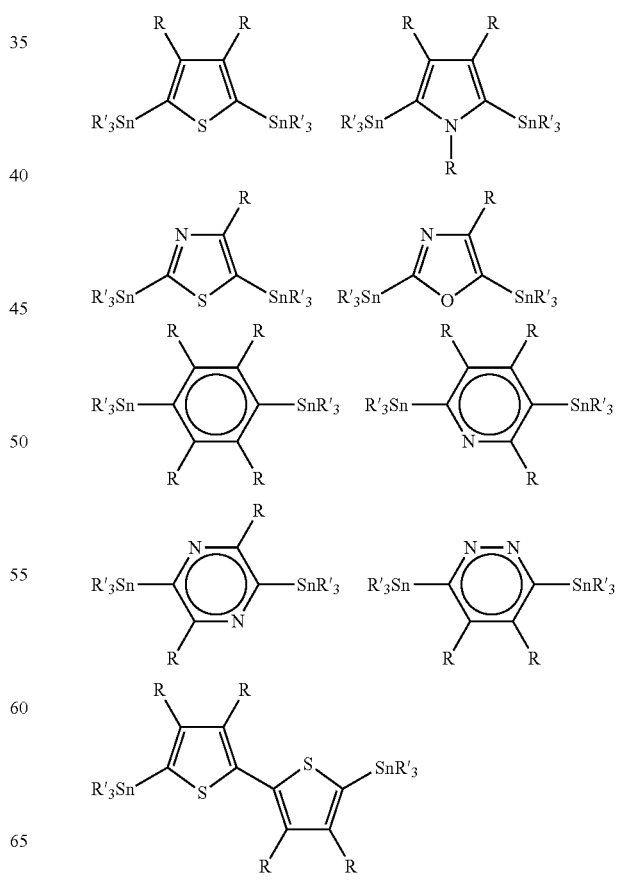

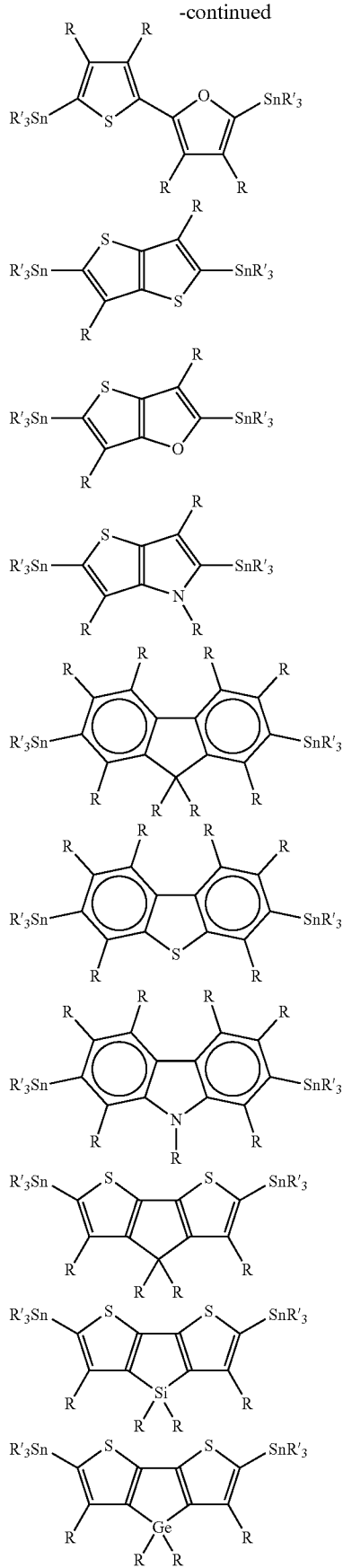
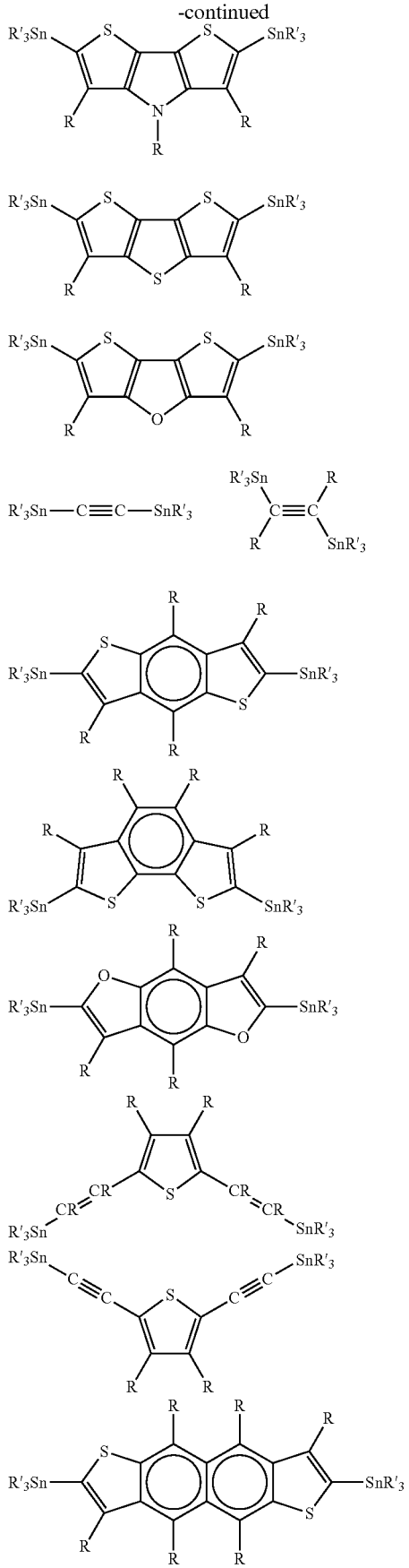

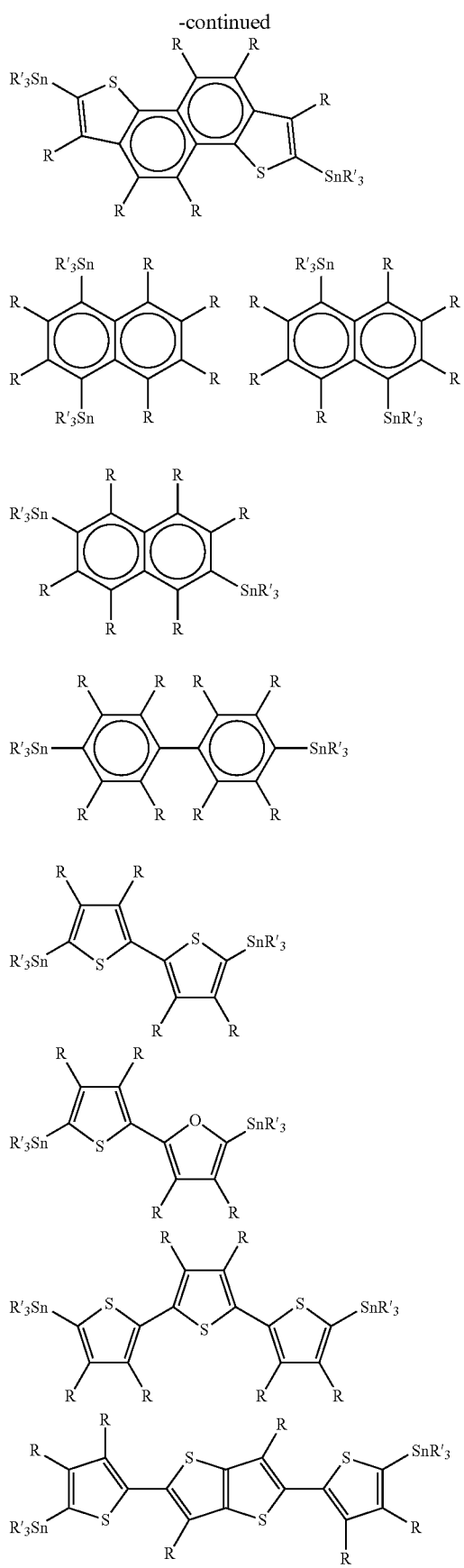
Concrete examples of the compound represented by the formula (21) are given below. However, the compound is not limited to the following concrete examples.
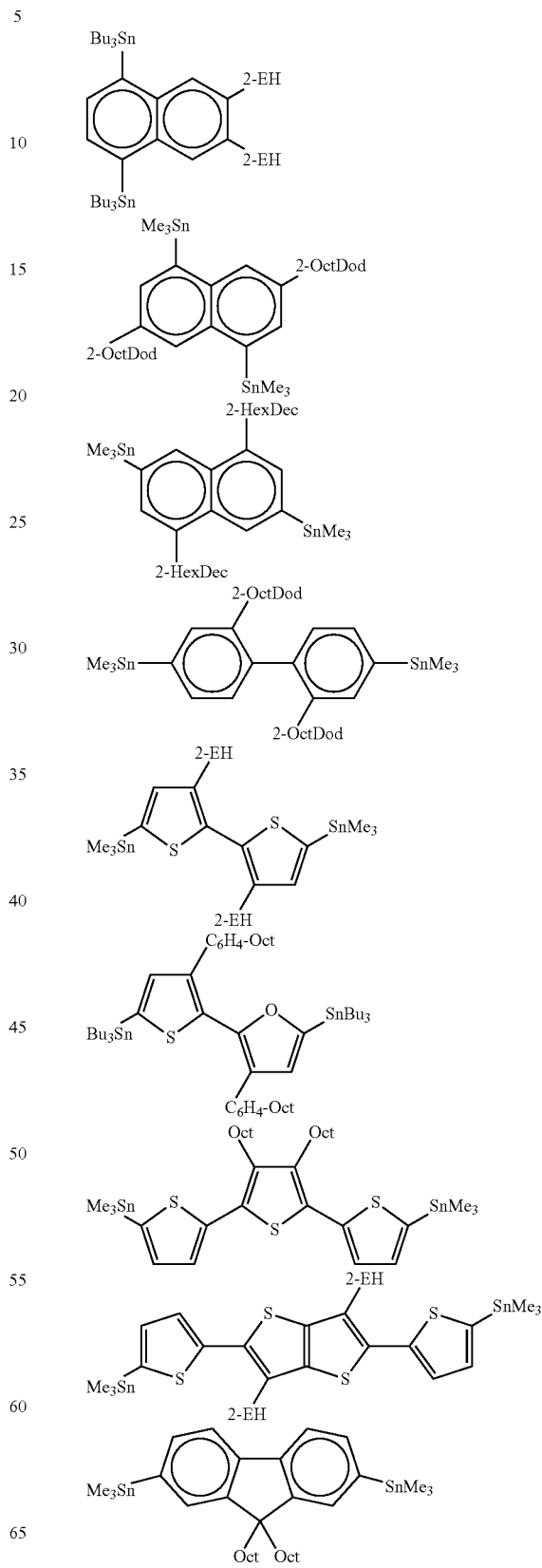

-continued

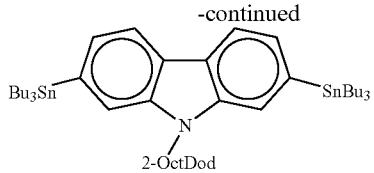
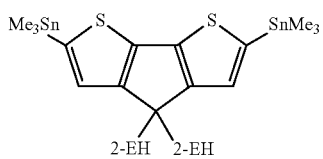
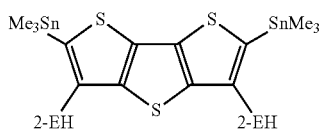
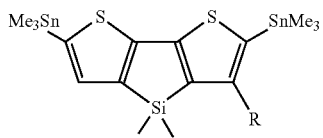
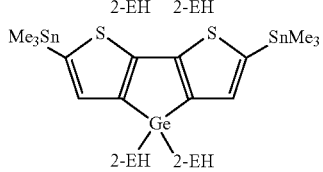
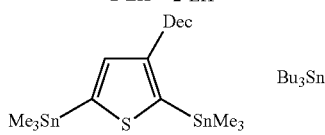
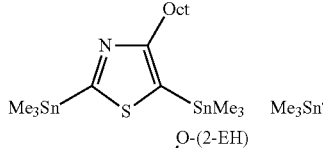
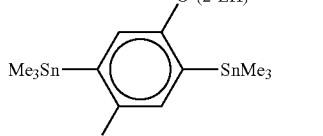
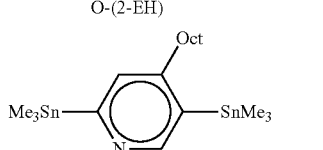
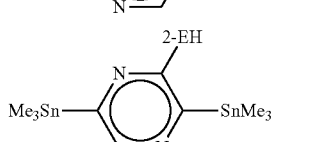
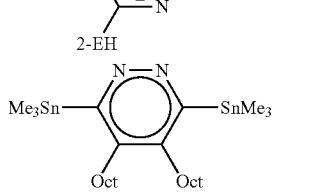

-continued

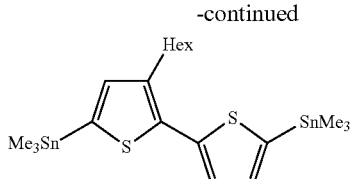
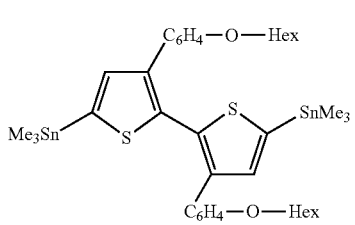
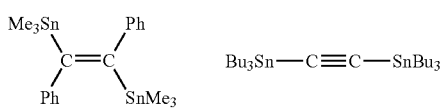

The polymer of the embodiment may have such a cross-linking group as described above. As monomers having the cross-linking group as the R3 group and the R4 group being the end group, there can be cited R3-Y, R4-Y, R3-SnR'$_3$, R4-SnR'$_3$, and so on. Concrete examples of the cross-linking group are as described above. Concrete examples of a compound having the cross-linking group are given below. However, the compound having the cross-linking group is not limited to the following concrete examples.

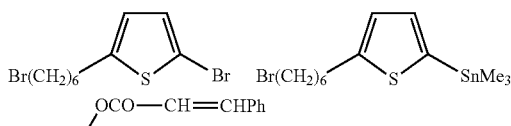
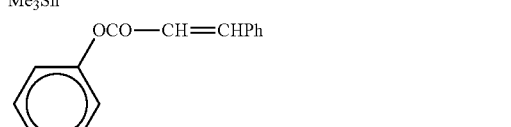
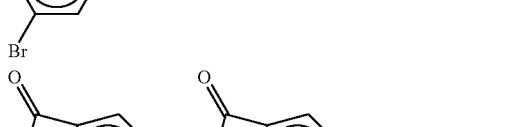
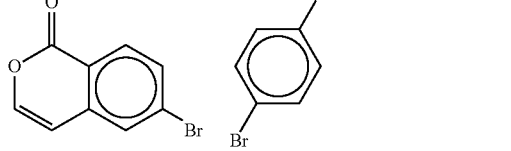

-continued

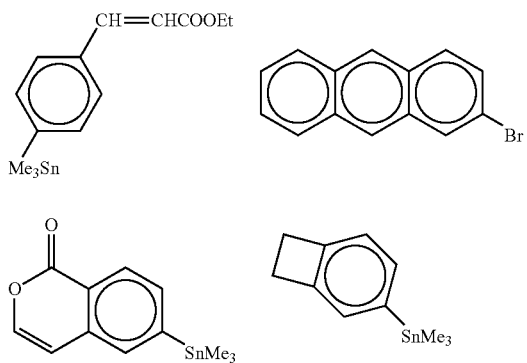

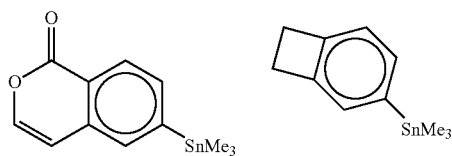

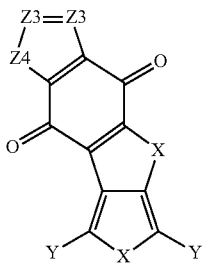

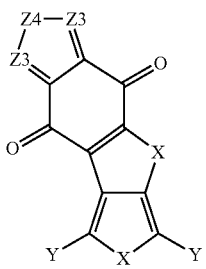

2-OctDod

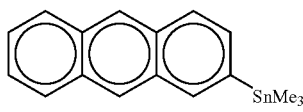

Further, as the monomer having the cross-linking group, for example, the following formulas (22) to (25) can be cited. However, the monomer having the cross-linking group is not limited to the following compounds.

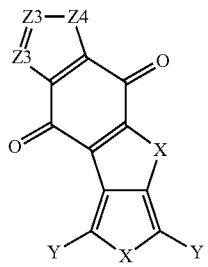
(22)

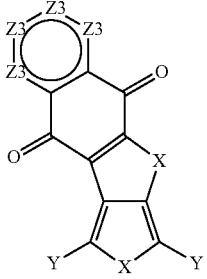

(23)

(24)

(25)

Concrete examples of the compound having the cross-linking group are given below. However, the compound having the cross-linking group is not limited to the following concrete examples.

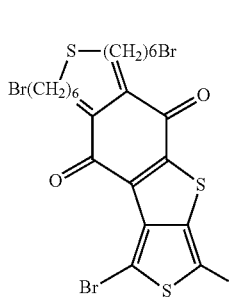

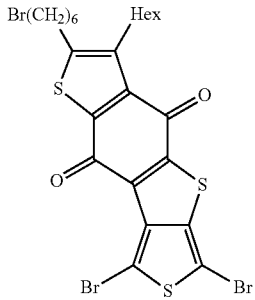

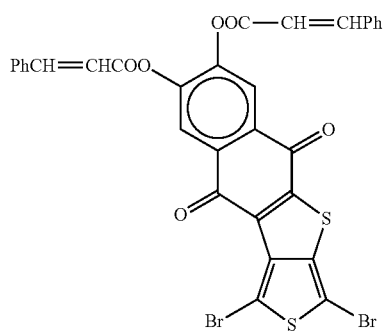

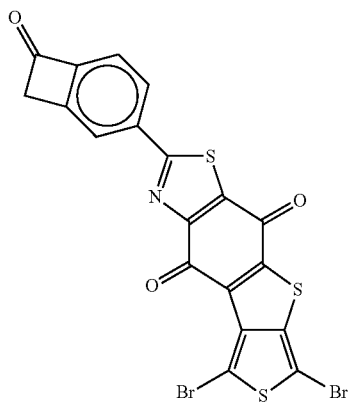
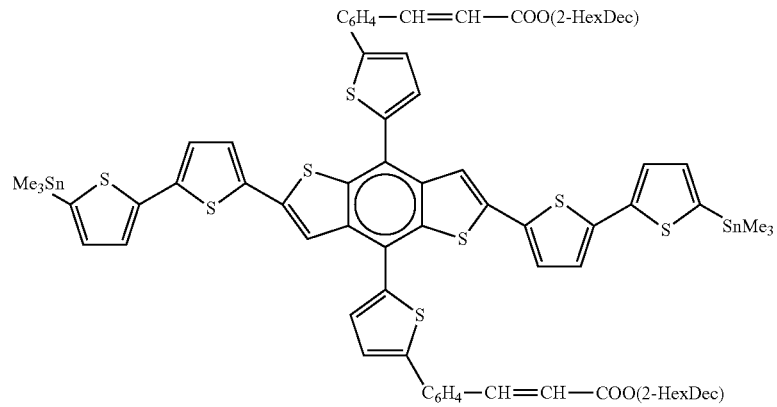
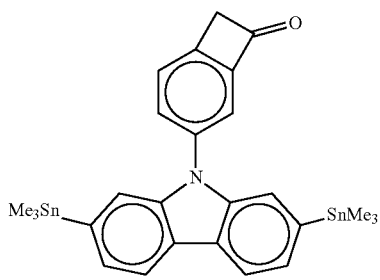
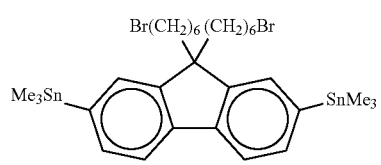
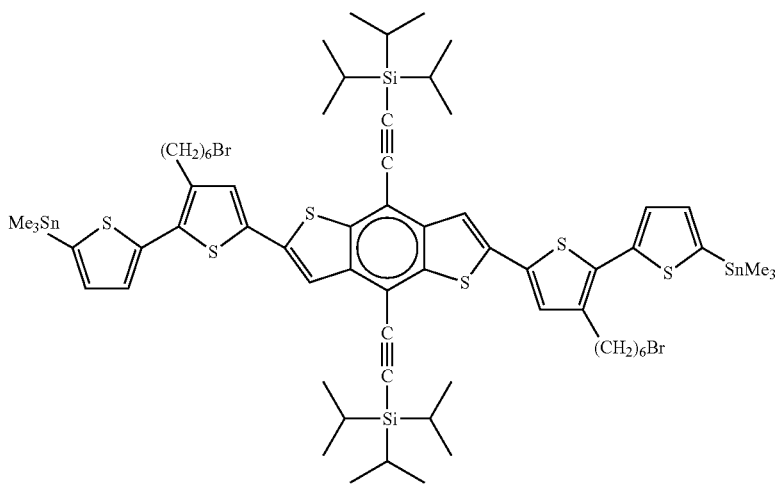
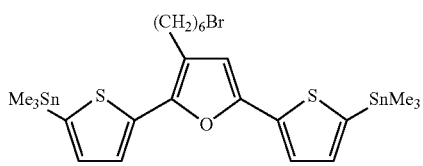

The polymer of the embodiment can be synthesized by using the Suzuki coupling reaction. The polymer is synthesized by polymerizing the compound represented by the formula (26) and the compound represented by the formula (27), for example. In the following formulas, Q indicates a boric acid ester residue and represents a group obtained by removing a hydroxy group from boric acid diester. Concrete examples of the Q group are given below, but the Q group is not limited to these.

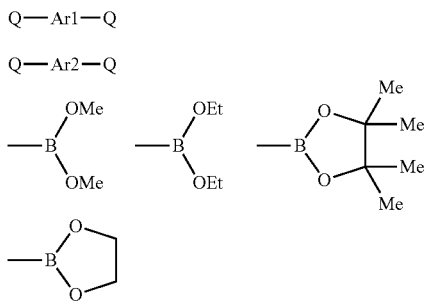

(26)
(27)

[Solar Cell]

A solar cell of the embodiment includes a photoelectric conversion element that includes a pair of electrodes and a photoelectric conversion layer disposed therebetween and containing an organic material. As a layer containing the organic material among respective layers constituting the photoelectric conversion layer, an active layer, a buffer layer, and so on can be cited. As the active layer containing the organic material, for example, a layer having a p-type semiconductor material (electron donor) that contains the above-described polymer of the embodiment and an n-type semiconductor material (electron acceptor) can be cited. The photoelectric conversion element that includes such a photoelectric conversion layer containing an organic material can be applied not only to a solar cell but also to a photosensor or a light emitting element.

[Organic Thin-Film Solar Cell]

The solar cell of the embodiment will be described with reference to the Figure. A solar cell element 100 illustrated in the Figure includes: a substrate 110; a first electrode 120; a photoelectric conversion layer 130; and a second electrode 140. The Figure illustrates a solar cell element (photoelectric conversion element) used for a general organic thin-film solar cell, but the configuration of the solar cell element is not limited to this. The photoelectric conversion layer 130 includes: a first buffer layer 131; an active layer 132; and a second buffer layer 133. The buffer layers 131, 133 are disposed as necessary. The first electrode 120 is an electrode to collect an electron (to be sometimes described as a cathode, hereinafter). The second electrode 140 is an electrode to collect a hole (to be sometimes described as an anode, hereinafter). In The Figure, the cathode 120 is disposed in a substrate 110 side, but the cathode 120 and the anode 140 may be reversed. These respective parts will be described below.

<Active Layer (132)>

The active layer 132 in the solar cell element 100 of the embodiment contains a p-type semiconductor material (electron donor) and an n-type semiconductor material (electron acceptor). The p-type semiconductor material has the above-described polymer of the embodiment. The concrete constitution of the polymer as the p-type semiconductor material is as described previously. The n-type semiconductor material (electron acceptor) will be described below. The active layer 132 may contain a plurality of kinds of p-type semiconductor materials and a plurality of kinds of n-type semiconductor materials.

<n-Type Semiconductor Material>

As the n-type semiconductor material (electron acceptor) contained in the active layer 132, there can be cited a phthalocyanine derivative, a fullerene or a fullerene derivative, a boron-containing polymer, poly(benzobis imidazo benzophenanthroline), and so on, but the n-type semiconductor material is not limited to these. Among the above, the fullerene derivative is preferable. As concrete examples of the fullerene derivative, there can be cited 1',1'',4',4''-Tetrahydro-di[1,4]methanonaphthaleno[1,2:2',3',56,60:2'',3''][5,6]fullerene-C60(indene-$C_{60}$bisadduct: IC60BA), [6,6]-Phenyl C61 butyric acid methyl ester (PC60BM), [6,6]-Phenyl C71 butyric acid methyl ester (PC70BM), Dihyrdonaphtyl-based[60]fullerene bisadducts (NC60BA), Dihyrdonaphtyl-based[70]fullerene bisadducts (NC70BA), and so on, but the fullerene derivative is not limited to these.

<Constitution and Structure of Active Layer>

In order to transfer an electron from the electron donor (p-type semiconductor) to the electron acceptor (n-type semiconductor) efficiently, a relativity of LUMO energy levels between the p-type semiconductor material and the n-type semiconductor material is important. Concretely, the LUMO energy level of the p-type semiconductor material is preferably higher than the LUMO energy level of the n-type semiconductor material by a predetermined energy. In other words, an electron affinity of the p-type semiconductor material is preferably larger than an electron affinity of the n-type semiconductor material by the predetermined energy.

If the LUMO energy level of the n-type semiconductor material is too high, transfer of the electron is unlikely to occur, and thus a short-circuit current (Jsc) of the solar cell element 100 tends to become low. On the other hand, an open-circuit voltage (Voc) of the solar cell element 100 is determined by a difference between the HOMO energy level of the p-type semiconductor material and the LUMO energy level of the n-type semiconductor material. Therefore, if the LUMO energy level of the n-type semiconductor material is too low, the Voc tends to become low. That is, in order to achieve higher conversion efficiency, it is not enough to simply select the n-type semiconductor material whose LUMO energy level is high or whose LUMO energy level is low.

The above-described fifth polymer of the embodiment can adjust the LUMO energy level by selecting its substituent. That is, as a result of changing substituents of two kinds of monomers constituting a copolymer, compounds having various energy levels can be obtained. In order to obtain the monomer having various substituents, a known technique such as esterification, etherification, or cross-coupling, for example, can be used. However, a suitable combination of the p-type semiconductor material and the n-type semiconductor material is not simply determined only based on the LUMO energy level and the HOMO energy level.

In the solar cell element 100, light is absorbed by the active layer 132, charge separation occurs in an interface between the p-type semiconductor and the n-type semiconductor, and holes and electrons that have been generated are extracted from the electrodes 120, 140. The thickness of the active layer 132 is not limited in particular, but the thickness of the active layer 132 is preferable to be 10 nm to 1000 nm, and further preferable to be 50 nm to 250 nm. By making the thickness of the active layer 132 become 10 nm or more, uniformity of the layer is maintained and a short circuit becomes unlikely to occur. By making the thickness of the active layer 132 become 1000 nm or less, internal resistance can be made small, and further as a result that the distance between the electrodes 120 and 140 becomes closer, electric charges can be well diffused.

As a concrete structure of the active layer 132, there can be cited a thin film laminated type in which a p-type semiconductor layer and an n-type semiconductor layer are laminated, and a bulk hetero junction type in which a p-type semiconductor material and an n-type semiconductor material are mixed. The active layer 132 of the thin film laminated type is disposed between the p-type semiconductor layer and the n-type semiconductor layer, and may have a layer (i layer) in which the p-type semiconductor material and the n-type semiconductor material are mixed. The solar cell element 100 of the embodiment preferably includes the active layer 132 having the bulk hetero junction structure in which the p-type semiconductor material and the n-type semiconductor material are mixed.

The bulk hetero junction type active layer 132 contains the p-type semiconductor material and the n-type semiconductor material. In the active layer 132, a p-type semiconductor phase and an n-type semiconductor phase are phase-separated from each other. When the active layer 132 absorbs light, a negative charge (electron) and a positive charge (hole) are separated in the interface of these phases thereof, and transferred to the electrodes 120, 140 through the respective semiconductors. In the bulk hetero junction type active layer 132, a phase separation structure of the p-type semiconductor phase and the n-type semiconductor phase affects a light absorption process, a diffusion process of excitons, a dissociation process of the excitons (charge generation process), a carrier transportation process, and the like. Therefore, in order to increase photoelectric conversion efficiency of the solar cell element 100, it is preferable to make the phase separation structure of the p-type semiconductor phase and the n-type semiconductor phase in the active layer 132 appropriate.

<Forming Method of Active Layer>

A forming method of the active layer 132 is not limited in particular, but it is preferable to apply a wet coating method such as a spin coating method, an ink-jet method, a doctor blade method, or a drop casting method. In this case, a solvent is selected in which the p-type semiconductor material (the above-described polymer of the embodiment) and the n-type semiconductor material are soluble, and a coating solution containing the p-type semiconductor material made of the polymer and the n-type semiconductor material is fabricated. By applying this coating solution, the bulk hetero junction type active layer 132 can be formed.

Kinds of the solvent are not limited in particular as long as the solvent can dissolve a semiconductor material uniformly. The solvent can be selected, for example, from among aliphatic hydrocarbons such as hexane, heptane, octane, isooctane, nonane, and decane, aromatic hydrocarbons such as toluene, xylene, chlorobenzene, and orthodichlorobenzene, low alcohols such as methanol, ethanol, and propanol, ketones such as acetone, methyl ethyl ketone, cyclopentanone, and cyclohexanone, esters such as ethyl acetate, butyl acetate, and methyl lactate, halogen hydrocarbons such as chloroform, methylene chloride, dichloroethane, trichloroethane, and trichloroethylene, ethers such as ethyl ether, tetrahydrofuran, and dioxane, amides such as dimethylformamide and dimethylacetamide, and so on.

<Additive to Active Layer Coating Solution>

In a case where the bulk hetero junction type active layer 132 is formed by a coating method, addition of a compound with a low molecular weight to a coating solution sometimes improves the photoelectric conversion efficiency. As a mechanism where a phase separation structure is optimized by the additive and the photoelectric conversion efficiency improves, a plurality of causes can be considered. As one of the causes, it is considered that existence of the additive suppresses aggregation of p-type semiconductor materials to each other or of n-type semiconductor materials to each other. In other words, without the additive, a solvent of the active layer coating solution (ink) normally volatilizes immediately after coating. It is considered that the p-type semiconductor material and the n-type semiconductor material that remain as residual components on this occasion each form a large aggregate. In such a case, a joint area (area of an interface) between the p-type semiconductor material and the n-type semiconductor material becomes small, and therefore generation efficiency of a charge is lowered.

When the ink containing the additive is applied, the additive remains for a while even after volatilization of the solvent. In other words, since the additive exists in the p-type semiconductor material or in the n-type semiconductor material, or in peripheries of the both, aggregation of the p-type semiconductor material and/or the n-type semiconductor material is prevented. It is considered that the additive evaporates at low speed under a room temperature and a normal pressure after application of the ink. The p-type semiconductor material and the n-type semiconductor material are considered to aggregate as the additive evaporates, but since the remaining additive prevents aggregation, aggregates that are formed by the p-type semiconductor material and the n-type semiconductor material become smaller. Consequently, in the active layer 132, there is formed a phase separation structure that has a large joint area of the p-type semiconductor material and the n-type semiconductor material and has higher charge generation efficiency.

As described above, the additive preferably remains in the active layer 132 for a while even after volatilization of a main solvent of the ink. From such a viewpoint, a boiling point of the additive is preferably higher than that of the main solvent of the ink. Since boiling points of chlorobenzene and orthodichlorobenzene, which are often used as the main solvent of ink, are 131° C. and 181° C. respectively, a boiling point of the additive under the normal pressure (1000 hPa) is preferably higher than the above. From the similar viewpoint, a vapor pressure of the additive is preferably lower than a vapor pressure of the main solvent of the ink at the room temperature (25° C.). If the boiling point of the additive is too high, the additive does not disappear completely from the active layer 132 even after fabrication of an element, and it is supposed that an amount of the additive remaining in the active layer 132 increases. In such a case, it is considered that increasing impurities causes a reduction in a mobility, that is, a reduction in the photoelectric conversion efficiency. Therefore, it is also possible to say that it is preferable that the boiling point of the additive is not too high.

The boiling point of the additive under the normal pressure is preferable to be higher than the boiling point of the main solvent by a range of not less than 10° C. nor more than 200° C., and further is more preferable to be higher than the boiling point of the main solvent by a range of not less than 50° C. nor more than 100° C. If the boiling point of the additive is too low, aggregation of the n-type semiconductor material is apt to occur at the time of drying of the ink, resulting in that a morphology of the active layer 132 becomes large and there is a possibility that a surface becomes uneven. The additive is preferably liquid at the room temperature (25° C.) in view of facilitating ink fabrication. If the additive is solid at the room temperature, it is considered that dissolving the additive in the main solvent at the time of ink fabrication is difficult or that a long stirring time is required even if the additive is dissolved. In order to optimize the phase separation structure of the active layer 132, not only the boiling point of the additive but also compatibility of the additive with the p-type semiconductor material and the n-type semiconductor material is important. In other words, since the additive interacts with the p-type semiconductor material and the n-type semiconductor material, there is a possibility that crystallinity of the p-type semiconductor material or the n-type semiconductor material or the like changes depending on the structure of the additive, for example.

As a concrete example of the additive, there can be cited an aromatic compound such as alkane having a substituent or naphthalene having a substituent. As the substituent, there can be cited an aldehyde group, an oxo group, a hydroxy group, an alkoxy group, a thiol group, a thioalkyl group, a carboxyl group, an ester group, an amine group, an amide group, a fluoro group, a chloro group, a bromo group, an iodine group, a nitrille group, an epoxy group, an aryl group, and so on. The substituent may be single or may also be plural. As the substituent that alkane has, the thiol group or the iodine group is preferable. As the substituent that the aromatic compound such as naphthalene has, the bromo group or the chloro group is preferable. Since the additive preferably has a high boiling point as described above, a carbon number of alkane is preferable to be 6 or more, and further preferable to be 8 or more. Since the additive is preferably liquid at the room temperature as described above, the carbon number of the alkane is preferable to be 14 or less and further preferable to be 12 or less.

An amount of the additive contained in the ink (active layer coating solution) is preferable to be not less than 0.1 weight % nor more than 10 weight % to the total amount of the ink. Further, the above amount is more preferable to be not less than 0.5 weight % nor more than 3 weight % to the total amount of the ink. By setting the amount of the additive in such a range, a preferable phase separation structure can be obtained while decreasing the additive remaining in the active layer 132.

<Electrodes (120, 140)>

The electrodes 120 and 140 in the solar cell element 100 of the embodiment have a function to collect electrons or holes generated as a result of absorption of light by the active layer 132. Therefore, the first electrode 120 is preferable to be suitable for collection of an electron, and the second electrode 140 is preferable to be suitable for collection of a hole. At least one of the pair of electrodes 120 and 140 preferably has a light transmitting property and the both may also have the light transmitting property. Having the light transmitting property means that 40% or more of sunlight is transmitted. The electrode having the light transmitting property preferably transmits 70% or more of the sunlight, and this makes it easy for the light to be transmitted through a transparent electrode to reach the active layer 132. Transmittance of light can be measured by a common spectrophotometer, and indicates an average transmittance of visible light (400 nm to 800 nm), for example.

<Electrode (120) Suitable for Collection of Electron>

The electrode (cathode) 120 suitable for collection of the electron is generally an electrode constituted by a conductive material exhibiting a lower value of work function than the anode 140. Such a cathode 120 can extract the electron generated in the active layer 132 smoothly. As a forming material of the cathode 120, there can be used, for example, a metal such as lithium, sodium, potassium, cesium, calcium, or magnesium, or an alloy thereof, an inorganic salt such as lithium fluoride or cesium fluoride, and a metal oxide such as nickel oxide, aluminum oxide, lithium oxide, or cesium oxide. These materials are materials having a low work function, and therefore are suitable as the material of the cathode 120. Further, it is possible to provide a buffer layer 131 made of an n-type semiconductor having conductivity between the cathode 120 and the active layer 132. In such a case, a material having a high work function may also be used as the forming material of the cathode 120.

When the cathode 120 is a transparent electrode, it is possible to use a conductive metal oxide such as, for example, nickel oxide, tin oxide, indium oxide, indium tin oxide (ITO), fluorine-doped tin oxide (FTO), indium-zirconium oxide (IZO), titanium oxide, or zinc oxide, a composite or a laminate of a metal nanowire of gold, silver, copper, or the like or a carbon nanotube (CNT) and a conductive metal oxide, and the ITO is preferably used in particular.

The film thickness of the cathode 120 is not limited in particular, but is preferable to be not less than 10 nm nor more than 1 µm, and further preferable to be not less than 50 nm nor more than 300 nm. If the film thickness of the cathode 120 is too thin, sheet resistance becomes high, and if it is too thick, light transmittance is lowered. When the cathode 120 is a transparent electrode, it is preferable to select the film thickness so that both high light transmittance and low sheet resistance can be obtained. The sheet resistance of the cathode 120 is not limited in particular, but is preferable to be 500 Ω/or less, more preferable to be 200 Ω/or less, and normally 1 Ω/or more. In view of extracting a larger current, the sheet resistance is preferable to be small. As a forming method of the cathode 120, there can be cited a vacuum film forming method such as vapor deposition or sputtering, a method of forming a film by applying an ink containing a nano-particle or a precursor, and so on.

<Electrode (140) Suitable for Collection of Hole>

The electrode (anode) 140 suitable for collection of the hole is generally an electrode constituted by a conductive material exhibiting a higher value of work function than the cathode 120. Such an anode 140 can extract the hole generated in the active layer 132 smoothly. As a forming material of the anode 140, there can be used, for example, a metal such as platinum, gold, silver, copper, nickel, cobalt, iron, manganese, tungsten, titanium, zirconium, tin, zinc, aluminum, indium, or chromium, an alloy containing these, and so on. These materials are suitable for the material of the anode 140 because they have a high work function.

The above-described materials can be laminated with a conductive high molecular material represented by PEDOT/PSS made by doping a polystyrene sulfonic acid into a polythiophene derivative, and metal oxides having a high work function such as molybdenum oxide, vanadium oxide, nickel oxide, and copper oxide. For example, it is possible to provide a buffer layer 133 constituted by a conductive high molecular material and a metal oxide between the anode 140 and the active layer 132. When laminating the conductive high molecular material and the metal oxide, a metal suitable for the anode 140 such as aluminum or magnesium can be used in place of the above-described material having a high work function because the work function of the conductive high molecular material is high. The conductive high molecular material itself can also be used as the material of the anode 140. As the conductive high molecular material, there can be cited the above-described PEDOT/PSS, a material made by doping iodine or the like into polypyrrole and polyaniline, and so on. When the anode 140 is a transparent electrode, the above-described conductive metal oxide and the like can be used.

The film thickness of the anode 140 is not limited in particular, but is preferable to be not less than 10 nm nor more than 10 µm and more preferable to be not less than 50 nm nor more than 500 nm. If the film thickness of the anode 140 is too thin, sheet resistance becomes high, and if it is too thick, light transmittance is lowered. In a case where the anode 140 is a transparent electrode, it is preferable to select the film thickness so that both high light transmittance and low sheet resistance can be obtained. The sheet resistance of the anode 140 is not limited in particular, but is preferable to be 500 Ω/or less and more preferable to be 200Ω/or less. It is normally 1 Ω/or more. In view of extracting a larger current, the sheet resistance is preferable to be small. As a forming method of the anode 140, there can be cited a vacuum film forming method such as vapor deposition or sputtering, a method of forming a film by applying an ink containing a nano-particle or a precursor, and so on.

<Buffer Layer (131, 133)>

The solar cell element 100 of the embodiment may further have one buffer layer or more, in addition to the pair of electrodes 120 and 140 and the active layer 132 disposed therebetween. The buffer layers can be classified into an electron extraction layer 131 and a hole extraction layer 133. When the first electrode 120 is a cathode and the second electrode 140 is an anode, the electron extraction layer 131 is disposed between the active layer 132 and the cathode 120, and the hole extraction layer 133 is disposed between the active layer 132 and the anode 140.

<Electron Extraction Layer (131)>

The material of the electron extraction layer 131 is not limited in particular as long as the material is a material capable of improving extraction efficiency of the electron from the active layer 132 to the cathode 120. The forming materials of the electron extraction layer 131 are roughly categorized into an inorganic compound and an organic compound. The electron extraction layer 131 may be formed by using the material of only either one category of the above, or may also be formed by using the materials of both categories. A laminated body of an inorganic compound layer and an organic compound layer may also be used as the electron extraction layer 131.

As the inorganic compound material used for the electron extraction layer 131, a salt of an alkali metal such as lithium, sodium, potassium, or cesium, and an n-type oxide semiconductor compound such as titanium oxide ($TiO_x$) or zinc oxide (ZnO) are preferable. As the salt of the alkali metal, a fluoride salt such as lithium fluoride, sodium fluoride, potassium fluoride, or cesium fluoride is preferable. By using such a material, when using in combination with the cathode 120 made of aluminum or the like, it is possible to make a work function of the cathode 120 small and to raise a voltage applied to the inside of the solar cell element 100.

When the alkali metal salt is used as the forming material of the electron extraction layer 131, a vacuum film forming method such as vacuum deposition or sputtering can be applied to form the electron extraction layer 131. Above all, the electron extraction layer 131 is desirably formed by vacuum deposition by resistance heating. Using the vacuum deposition makes it possible to reduce a damage to other layers such as the active layer 132. The film thickness in this case is preferable to be not less than 0.1 nm nor more than 50 nm, and more preferable to be 20 nm or less. If the electron extraction layer 131 is too thin, an effect of improving the electron extraction efficiency becomes insufficient. If the electron extraction layer 131 is too thick, there is a possibility that a property of the element is impaired by the electron extraction layer 131 acting as a series resistance component.

When the titanium oxide is used as the forming material of the electron extraction layer 131, a vacuum film forming method such as sputtering can be applied to form the electron extraction layer 131. The electron extraction layer 131 made of the titanium oxide is more preferably formed by using a coating method. For example, it is possible to form the electron extraction layer 131 constituted by the titanium oxide by a sol gel method described in Adv. Mater. 18, 572 (2006). The film thickness in that case is normally not less than 0.1 nm nor more than 100 nm, and preferable to be not less than 5 nm nor more than 50 nm. If the electron extraction layer 131 is too thin, an effect of improving the electron extraction efficiency becomes insufficient. If the electron extraction layer 131 is too thick, there is a possibility that a property of the element is impaired by the electron extraction layer 131 acting as a series resistance component.

Also in a case where the zinc oxide is used as the forming material of the electron extraction layer 131, formation can be performed by using a vacuum film forming method such as sputtering. The electron extraction layer 131 is preferably formed by using a coating method. For example, according to a sol gel method described in Sol-Gel Science, C. J. Brinker, G. W. Scherer, Academic Press (1990), the electron extraction layer 131 constituted by the zinc oxide can be formed. The film thickness in that case is normally not less than 0.1 nm nor more than 400 nm, and preferable to be not less than 1 nm nor more than 50 nm. If the electron extraction layer 131 is too thin, an effect of improving the electron extraction efficiency becomes insufficient. If the electron extraction layer 131 is too thick, there is a possibility that a property of the element is impaired by the electron extraction layer 131 acting as a series resistance component.

As an organic compound material used as the electron extraction layer 131, there can be cited, for example, bathocuproine (BCP), bathophenanthrene (Bphen), (8-hydroxyquinolinato)aluminum (Alq3), a boron compound, an oxadiazole compound, a benzimidazole compound, a naphthalenetetracarboxylic acid anhydride (NTCDA), a perylenetetracarboxylic acid anhydride (PTCDA), a phosphineoxide compound, a phosphinesulfide compound, and so on, and a conductive polymer, but the organic compound material is not limited to these. It is also possible to dope a metal such as an alkali metal or an alkaline earth metal into the above-described organic compound material.

When the organic compound is used as the forming material of the electron extraction layer 131, the film thickness of the electron extraction layer 131 is normally not less than 0.5 nm nor more than 500 nm, and preferable to be not less than 1 nm nor more than 100 nm. If the electron extraction layer 131 is too thin, an effect of improving the electron extraction efficiency becomes insufficient. If the electron extraction layer 131 is too thick, there is a possibility that a property of the element is impaired by the electron extraction layer 131 acting as a series resistance component. When the electron extraction layer 131 is formed by using a plurality of materials, the entire thickness of the electron extraction layer 131 is normally not less than 0.1 nm nor more than 100 nm and preferable to be 60 nm or less.

<Hole Extraction Layer (133)>

The material of the hole extraction layer 133 is not limited in particular as long as the material is a material capable of improving extraction efficiency of the hole from the active layer 132 to the anode 140. Concretely, there can be cited a conductive polymer made by doping at least one of doping materials of sulfonic acid and iodine into polythiophene, polypyrrole, polyacetylene, triphenylenediaminepolypyrrole, polyaniline or the like. Among the above, the conductive polymer made by doping the sulfonic acid is preferable, and further, a PEDOT:PSS made by doping a polystyrene sulfonic acid into a polythiophene derivative is more preferable. A metal oxide having a high work function such as tungsten oxide or molybdenum oxide may also be used as the hole extraction layer 133. A thin film of a metal such as gold, indium, silver, or palladium can also be used as the hole extraction layer 133. The metal thin film can be used independently as the hole extraction layer 133. The metal thin film and the above-described conductive polymer can also be combined to be used as the hole extraction layer 133.

The film thickness of the hole extraction layer 133 is not limited in particular, but is normally not less than 1 nm nor more than 200 nm. The film thickness of the hole extraction layer 133 is preferable to be 5 nm or more and preferable to be 100 nm or less. If the film thickness of the hole extraction layer 133 is too thin, uniformity becomes insufficient and there is a tendency that a short circuit is likely to occur. If the film thickness of the hole extraction layer 133 is too thick, a resistance value is increased and there is a tendency that the hole is unlikely to be extracted.

<Forming Method of Buffer Layer>

The forming method of the buffer layers 131 and 133 is not limited in particular. Film forming methods of several materials are as described above. Generally, when a material having sublimability is used, a vacuum film forming method such as a vacuum deposition method can be used. When a material soluble to a solvent is used, a wet coating method such as spin-coating or ink-jet can be used.

<Substrate (110)>

The solar cell element 100 normally has the substrate 110 to be a supporter. That is, the electrodes 120 and 140, the active layer 132, and the buffer layers 131 and 133 are formed on the substrate 110. The material of the substrate 110 is not limited in particular. As the substrate material, there can be cited an inorganic material such as quartz, glass, sapphire, or titania, an organic material such as polyethylene terephthalate, polyethylene naphthalate, polyethersulfone, polyimide, nylon, polystyrene, a polyvinyl alcohol, an ethylene-vinyl alcohol copolymer, a fluorocarbon resin, a vinyl chloride, polyolefin such as polyethylene, cellulose, a polyvinylidene chloride, aramid, a polyphenylene sulfide, polyurethane, polycarbonate, polyarylate, polynorbornene, or an epoxy resin, a paper material such as paper or synthetic paper, a composite material made by applying or laminating a layer that gives an insulation performance to a metal such as stainless steel, titanium, or aluminum, and so on. As the glass, soda glass, blue plate glass, no-alkali glass, and so on can be cited. With regard to the quality of material of the glass, fewer eluted ions from the glass are better, so that the no-alkali glass is preferable.

The shape of the substrate 110 is not limited and a shape of board, film, sheet, or the like can be used, for example. The thickness of the substrate 110 is not limited in particular, either. The thickness of the substrate 110 is normally not less than 5 μm nor more than 20 mm, and preferable to be not less than 20 μm nor more than 10 mm. If the substrate 110 is too thin, there is a possibility that the strength of the solar cell element 100 becomes insufficient. If the substrate 110 is too thick, there is a possibility that cost becomes high or a weight becomes too heavy. In a case where the substrate 110 is glass, if it is too thin, a mechanical strength decreases to make the substrate 110 likely to crack, and thus the thickness thereof is preferable to be 0.01 mm or more and more preferable to be 0.1 mm or more. If it is too thick, the substrate 110 becomes heavy, and thus the thickness of the substrate 110 is preferable to be 10 mm or less and more preferable to be 3 mm or less.

<Method of Manufacturing Solar Cell Element 100>

The solar cell element 100 of the embodiment is fabricated by sequentially forming the electrode 120, the photoelectric conversion layer 130, and the electrode 140 on the substrate 110 by the above-described methods. When the buffer layers 131 and 133 are provided, the electrode 120, the buffer layer 131, the active layer 132, the buffer layer 133, and the electrode 140 only need to be formed on the substrate 110 sequentially. Further, a heat treatment (annealing treatment) is preferably performed on a laminated body obtained by sequentially forming each layer on the substrate 110. By performing the annealing treatment, heat stability and durability of the solar cell element 100 sometimes improve. The annealing treatment sometimes improves adhesion between the layers, which is considered to be one reason.

A heating temperature is normally 200° C. or less, and preferable to be 180° C. or less and more preferable to be 150° C. or less. The heating temperature is normally 50° C. or more and preferable to be 80° C. or more. If the temperature is too low, there is a possibility that an effect of improving adhesion cannot be obtained sufficiently. If the temperature is too high, there is a possibility that a compound contained in the active layer 132 is thermally decomposed, for example. Heating at a plurality of temperatures may be applied to the annealing treatment. A heating time is normally not less than 1 minute nor more than 3 hours, and preferable to be not less than 3 minutes nor more than 1 hour. The annealing treatment is preferably completed when an open-circuit voltage, a short-circuit current, and a fill factor, which are parameters of performance of the solar cell, reach predetermined values. The annealing treatment is preferably performed under a normal pressure, and also preferably performed in an inert gas atmosphere.

The solar cell of the embodiment can be fabricated by using an arbitrary method. For example, according to a known technique, a surface of the organic thin-film solar cell (solar cell element 100) is covered by an appropriate protective material for weather resistance improvement, and thereby the solar cell can be fabricated. As the protective material, there can be cited a weather-resistant protective film, an ultraviolet cutting film, a gas barrier film, a getter material film, a sealant, and so on. Besides, a generally known constitution can be added.

[Organic/Inorganic Hybrid Solar Cell]

Next, there will be explained another example of the solar cell of the embodiment. Here, an example where the solar cell of the embodiment is applied to an organic/inorganic hybrid solar cell will be described. The organic/inorganic hybrid solar cell has a laminated structure of a substrate/a cathode electrode/an electron extraction layer/an active layer/a hole extraction layer/an anode electrode (an inverted structure), for example. The position of the cathode electrode and the position of the anode electrode may be opposite to each other.

For the active layer of the organic/inorganic hybrid solar cell, an organic/inorganic mixed perovskite compound is used. Further, for the hole extraction layer of the organic/inorganic hybrid solar cell, a p-type semiconductor material is used. The p-type semiconductor material forming the hole extraction layer includes the above-described polymer of the embodiment. The concrete constitution of the polymer as the p-type semiconductor material is as described previously. The hole extraction layer may contain a plurality of kinds of p-type semiconductor materials.

In the organic/inorganic hybrid solar cell, radiated light is absorbed into the active layer containing the organic/inorganic mixed perovskite compound, and thereby charge separation occurs in the active layer. Electrons generated by the charge separation are extracted from the cathode electrode and holes are extracted from the anode electrode. In the organic/inorganic hybrid solar cell, the same buffer layers (electron extraction layer and hole extraction layer) as those of the organic thin-film solar cell can be used. The organic/inorganic hybrid solar cell is fabricated by the same method as that of the above-described organic thin-film solar cell.

The organic/inorganic mixed perovskite compound used for the active layer of the organic/inorganic hybrid solar cell has a composition represented by the following expression (28), for example.

$$CH_3NH_4ML_3 \qquad (28)$$

In the expression (28), M indicates at least one atom selected from the group consisting of lead (Pb) and tin (Sn), and L indicates at least one atom selected from the group consisting of iodine (I), bromine (Br), and chlorine (Cl).

As a fabrication method of the active layer, there can be cited a method of vacuum-depositing the above-described perovskite compound or a precursor thereof, and a method in which a solution obtained by dissolving the perovskite compound or the precursor thereof in a solvent is applied to be heated and dried. As the precursor of the perovskite compound, for example, a mixture of methylammonium halide and lead halide or stannic halide can be cited. The active layer is formed as a result that the solution obtained by dissolving the perovskite compound or the precursor thereof in a solvent is applied to be heated and dried. Alternatively, the active layer can also be formed as a result that as the precursor, a lead halide or stannic halide solution is applied to be dried, and then a methylammonium halide solution is applied to be heated and dried.

The kind of solvent is not limited in particular as long as the solvent is one capable of dissolving the perovskite compound or the precursor thereof uniformly. The solvent is selected from among, for example, low alcohols such as methanol, ethanol, propanol, ethylene glycol, and methoxyethanol, ketones such as acetone, methyl ethyl ketone, cyclopentanone, and cyclohexanone, esters such as ethyl acetate, butyl acetate, and methyl lactate, ethers such as ethyl ether, tetrahydrofuran, and dioxane, and amides such as dimethylformamide and dimethylacetamide.

The thickness of the active layer is not limited in particular, but is preferable to be not less than 10 nm nor more than 1000 nm, and further preferable to be not less than 50 nm nor more than 600 nm. When the thickness of the active layer is 10 nm or more, uniformity of the active layer is maintained and a short circuit becomes unlikely to occur. When the thickness of the active layer is 1000 nm or less, internal resistance can be made small, and further as a result that the distance between the electrodes becomes closer, electric charges can be well diffused.

In the organic/inorganic hybrid solar cell of the embodiment, between the active layer and the anode electrode, the hole extraction layer made of the p-type semiconductor material containing the above-described polymer of the embodiment (buffer layer) is provided. The hole extraction layer is formed by applying a solution obtained by dissolving the polymer in a solvent, for example. The thickness of the hole extraction layer is not limited in particular, but is normally not less than 1 nm nor more than 100 nm. The thickness of the hole extraction layer is preferable to be not less than 2 nm nor more than 50 nm. If the thickness of the hole extraction layer is too thin, uniformity becomes insufficient and there is a tendency that a short circuit is likely to occur. If the thickness of the hole extraction layer is too thick, a resistance value increases and there is a tendency that a hole is unlikely to be extracted.

In the organic/inorganic hybrid solar cell of the embodiment, similarly to the above-described organic thin-film solar cell, the electron extraction layer (buffer layer) provided between the active layer and the cathode layer may be provided. The forming material and the forming method of the electron extraction layer are as described above. Further, the forming materials of the anode electrode and the cathode electrode are also as described above. The other constitutions of the organic/inorganic hybrid solar cell are also the same as those of the above-described organic thin-film solar cell.

EXAMPLES

Next, there will be described examples and their evaluation results.

[Synthesis Example of Acceptor Unit Monomer]

A monomer to be used for polymer synthesis is synthesized. A synthetic pathway of the monomer is given below.

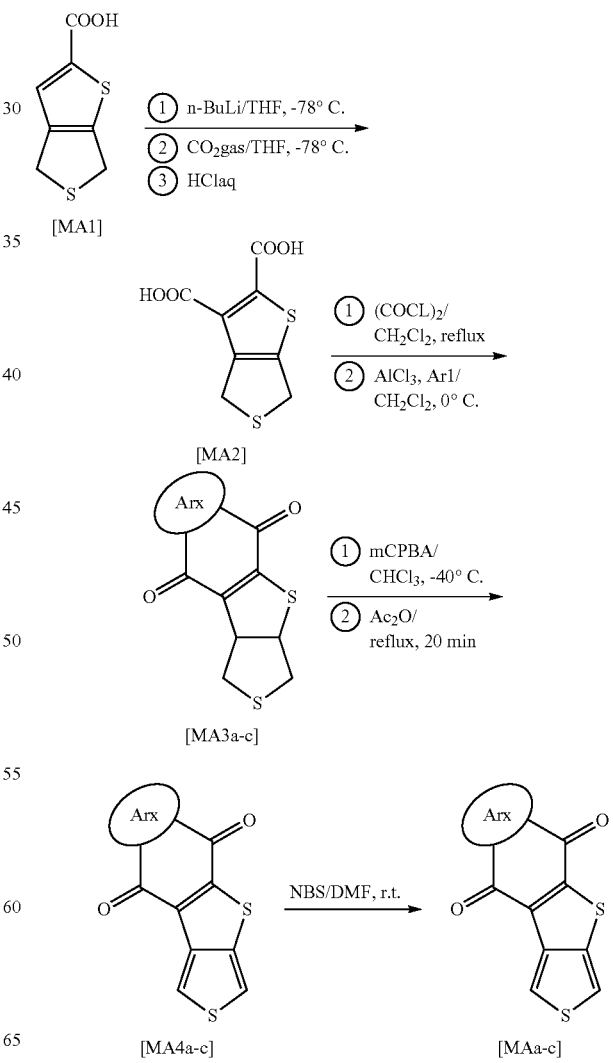

Arx:

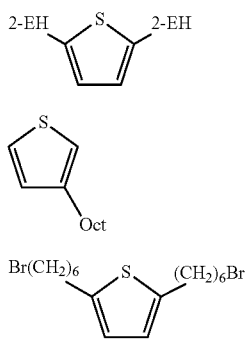

(Synthesis of Compound MA2)

In a four-neck flask, 16,878 g (0.0906 mol) of a compound MA1 is weighed, a thermometer, a $CO_2$ introducing and reflux tube, and a dropping funnel are attached, a rotor is put in, and after a nitrogen atmosphere is made by supplying nitrogen, 400 mL of anhydrous tetrahydrofuran (THF) is added. In the dropping funnel, 126 mL of a 1.6 M n-butyl-lithium hexane solution is put. After the flask is cooled to −78° C. in a dry ice/acetone bathing, the resultant solution is dropped from the dropping funnel. After the dropping, at the temperature, a reaction is caused for 2 hours. While maintaining the temperature, $CO_2$ is introduced through a $CO_2$ conduit to cause bubbling for 6 hours. A reaction mixture is poured into a water to be acidified with hydrochloric acid, and then is extracted by ethyl acetate, and cleaning is performed three times with a NaCl aqueous solution.

An organic layer is dried by anhydrous magnesium sulfate, a solvent is removed under a reduced pressure, and a solid body is obtained. The product is cleaned with chloroform, and thereby 13.678 g (59.4% yield) of an ocherous solid body being a compound MA2 is obtained. The obtained solid body is evaluated by using a NMR apparatus (JNM-GSX270 (trade name), manufactured by JEOL Ltd.). The obtained result is "1H-NMR (270 MHz, CD3OD) ∂: 4.27-4.21 (m, 2H), 4.21-4.16 (m, 2H), 4.99 (s, 1H); 13C-NMR (CD3OD) 166.88, 165.73, 148.74, 147.31, 142.69, 131.37."

(Synthesis of Compound MA3a)

Into a three-neck flask, 3.612 g (0.0157 mol) of the compound MA2 is weighed, a thermometer, an $N_2$ introducing and reflux tube, and a dropping funnel are attached, a rotor is put in, and after a nitrogen atmosphere is made by supplying nitrogen, 250 mL of anhydrous dichloromethane (DCM) and a several drops of anhydrous dimethylformamide (DMF) are added. Into the dropping funnel, a solution obtained by dissolving 8.097 g (0.0628 mol) oxalyl chloride in anhydrous DCM (20 mL) is put. Under room temperature, the resultant solution is gradually dropped from the dropping funnel, after gas generation is finished, a reaction is caused for about 8 hours by heating reflux. Under a reduced pressure, a solvent and an excessive amount of the oxalyl chloride are removed. Into the residue, 50 mL of anhydrous DCM is added to be dissolved.

The inside of a four-neck flask with a thermometer, an argon conduit attached reflux tube, and a dropping funnel attached thereto is brought into an argon atmosphere, and then into the four-neck flask, 8.67 g of anhydrous aluminum chloride and anhydrous DCM (30 mL) are added. Into the dropping funnel, the previously described solution is added. The flask is cooled by ice water and the solution is dropped from the dropping funnel at −0° C. or less. A solution obtained by dissolving 7.282 g (0.0236 mol) of 2,5-di(2-ethylhexyl)thiophene in anhydrous DCM (30 ml) is put into the dropping funnel. The resultant solution is dropped from the dropping funnel at 0° C. or less, and at the temperature, a reaction is caused for 2 hours. A reaction mixture is poured into an ice water to be extracted by anhydrous DCM.

An organic layer is dried by anhydrous magnesium sulfate and a solvent is removed under a reduced pressure, and then a reactant is refined by column chromatography (silica gel, developing solvent; hexane:toluene=1:1), and thereby 5.341 g (67.6% yield) of a solid body being a compound MA3a is obtained. The obtained solid body is evaluated by a NMR apparatus, and there is obtained a result "1H-NMR (270 MHz, CDCl3) ∂: 4.35 (dd, 2H, J=2.97 Hz, 1.65 Hz), 4.18 (dd, 2H, J=2.97 Hz, 1.65 Hz), 3.38-3.12 (m, 4H), 1.90-1.64 (m, 2H), 1.51-1.11 (m, 16H), 1.11-0.73 (m, 12H); 13C-NMR (CD3OD) 177.29, 175.95, 155.10, 154.72, 152.00, 148.18, 144.07, 137.59, 131.78, 131.38, 41.10, 40.95, 33.83, 33.52, 33.01, 32.58, 32.57, 28.64, 28.59, 25.88, 25.56, 23.00, 22.97, 14.06, 10.74, 10.67."

(Synthesis of Compound MA3b)

A compound MA3b is synthesized by the same method as that of synthesizing the compound MA3a except that 3-octylthiophene is used in place of the 2,5-di(2-ethylhexyl)thiophene used for the synthesis of the compound MA3a. A solid body (10.5% yield) of the compound MA3b is obtained. The obtained solid body is evaluated by a NMR apparatus, and there is obtained a result "1H-NMR (270 MHz, CDCl3) ∂: 7.32 (s, 1H), 4.31 (dd, 2H, J=2.97 Hz, 1.65 Hz), 4.19 (dd, 2H, J=2.97 Hz, 1.65 Hz), 2.97 (t, 2H, J=7.58 Hz), 1.85-1.53 (m, 2H), 1.48-1.14 (m, 10H), 0.88 (t, 3H, J=6.76 Hz)."

(Synthesis of Compound MA3c)

A compound MA3c is synthesized by the same method as that of synthesizing the compound MA3a except that 2,5-di(6-bromohexyl)thiophene is used in place of the 2,5-di(2-ethylhexyl)thiophene used for the synthesis of the compound MA3a. A solid body (50.4% yield) of the compound MA3c is obtained. The obtained solid body is evaluated by a NMR apparatus, and there is obtained a result "1H-NMR (270 MHz, CDCl3) ∂: 4.35 (dd, 2H, J=2.97 Hz, 1.65 Hz), 4.18 (dd, 2H, J=2.97 Hz, 1.65 Hz), 3.38-3.12 (m, 4H), 1.90-1.64 (m, 2H), 1.51-1.11 (m, 16H), 1.11-0.73 (m, 12H)."

(Synthesis of Compound MA4a)

The inside of a four-neck flask with a thermometer, an argon conduit attached reflux tube, and a dropping funnel attached thereto is brought into an argon atmosphere, and then into the four-neck flask, the compound MA3a (4.174 g, 0.00830 mol) and trichloromethane (TCM) (20 mL) are added. Into the dropping funnel, a solution obtained by dissolving 1.985 g (72 wt %, 0.00830 mol) of m-chloroperbenzoic acid in TCM (30 mL) is put. The flask is cooled to −40° C. and then the resultant solution is dropped from the dropping funnel. After dropping, the temperature is returned to room temperature, and then a reaction is caused at room temperature for 3 hours. To a reactant obtained by removing a solvent therefrom under a reduced pressure, 30 mL of acetic anhydride is added to be heated, and a reaction is caused for 20 minutes at a solvent reflux temperature.

After the solvent is removed under a reduced pressure, the reactant is refined by column chromatography (silica gel, developing solvent; hexane:toluene=1:1), and thereby 3.797 g (91.3% yield) of a solid body being a compound MA4a is obtained. The obtained solid body is evaluated by a NMR apparatus, and there is obtained a result "1H-NMR (270 MHz, CDCl3) ∂: 8.31 (d, 1H, J=2.97 Hz), 7.38 (d, 2H, J=2.97 Hz), 3.44-3.13 (m, 4H), 1.90-1.65 (m, 2H), 1.55-1.14 (m, 16H), 1.06-0.73 (m, 12H); 13C-NMR (CD3OD) 177.92, 176.72, 156.16, 155.28, 154.59, 142.37, 138.30, 132.61, 131.76, 131.17, 120.25, 112.54, 41.07, 40.90, 33.65, 33.50, 32.65, 32.59, 28.69, 28.60, 25.88, 23.01, 14.09, 10.77, 10.68."

(Synthesis of Compound MA4b)

A compound MA4b is synthesized by the same method as that of synthesizing the compound MA4a except that the compound MA3b is used in place of the compound MA3a used for the synthesis of the compound MA4a. There is obtained 1.806 g (56% yield) of a solid body being the compound MA4b. The obtained solid body is evaluated by a NMR apparatus, and there is obtained a result "1H-NMR (270 MHz, CDCl3) ∂: 8.30 (d, 1H, J=2.97 Hz), 7.38 (d, 2H, J=2.97 Hz), 7.32 (s, 1H), 2.97 (t, 2H, J=7.58 Hz), 1.85-1.53 (m, 2H), 1.48-1.14 (m, 10H), 0.88 (t, 3H, J=6.76 Hz)."

(Synthesis of Compound MA4c)

A compound MA4c is synthesized by the same method as that of synthesizing the compound MA4a except that the compound MA3c is used in place of the compound MA3a used for the synthesis of the compound MA4a. There is obtained 2.801 g (56% yield) of a solid body being the compound MA4c. The obtained solid body is evaluated by a NMR apparatus, and there is obtained a result "1H-NMR (270 MHz, CDCl3) ∂: 8.31, (d, 1H, J=2.97 Hz), 7.38 (d, 2H, J=2.97 Hz), 3.45-3.1 (m, 8H), 1.90-1.70 (m, 8H), 1.55-1.3 (m, 8H)."

(Synthesis of Dibromo-Substituted Monomer MAa)

Into a three-neck flask with a reflux tube, a dropping funnel, and a rotor attached thereto, 3.694 g (0.0674 mol) of the compound MA 4a and 80 ml of anhydrous DMF are added. A solution obtained by dissolving 3.289 g (0.0185 mol) of N-bromosuccinimide in 20 mL of anhydrous DMF is put into the dropping funnel. The resultant solution is dropped from the dropping funnel under room temperature. After the dropping, a reaction is caused for 1 day at room temperature. After a sodium thiosulfate aqueous solution is added and processing is performed for 30 minutes, extraction is performed by chloroform, cleaning is performed two times with water, and cleaning is performed one time with a NaCl aqueous solution.

An organic layer is dried by anhydrous magnesium. Under a reduced pressure, a solvent is condensed and a residue is refined by column chromatography (silica gel, developing solvent; hexane:toluene=2:1), and thereby 4.135 g (85.6% yield) of a reddish orange solid body being a monomer MAa is obtained. The obtained solid body is evaluated by a NMR apparatus, and there is obtained a result "1H-NMR (270 MHz, CDCl3) ∂: 3.36-3.16 (m, 4H), 1.87-1.67 (m, 2H), 1.50-1.20 (m, 16H), 1.00-0.78 (m, 12H); 13C-NMR (CD3OD) 177.01, 175.56, 157.89, 155.53, 155.07, 140.78, 140.66, 133.66, 131.56, 130.376, 105.48, 98.92, 41.16, 40.96, 33.59, 33.75, 32.76, 32.55, 28.75, 28.58, 26.01, 25.85, 22.98, 22.95, 14.12, 14.07, 10.86, 10.68."

(Synthesis of Dibromo-Substituted Monomer MAb)

A monomer MAb is synthesized by the same method as that of synthesizing the monomer MAa except that the compound MA4b is used in place of the compound MA4a used for the synthesis of the monomer MAa. There is obtained 4.135 g (85.6% yield) of a reddish orange solid body being the monomer MAb. The obtained solid body is evaluated by a NMR apparatus, and there is obtained a result "1H-NMR (270 MHz, CDCl3) ∂: 3.36-3.16 (m, 4H), 1.87-1.67 (m, 2H), 1.50-1.20 (m, 16H), 1.00-0.78 (m, 12H)."

(Synthesis of Dibromo-Substituted Monomer MAc)

A monomer MAc is synthesized by the same method as that of synthesizing the monomer MAa except that the compound MA4c is used in place of the compound MA4a used for the synthesis of the monomer MAa. There is obtained 4.135 g (85.6% yield) of a reddish orange solid body being the monomer MAc. The obtained solid body is evaluated by a NMR apparatus, and there is obtained a result "1H-NMR (270 MHz, CDCl3) ∂: 3.36-3.16 (m, 4H), 1.87-1.67 (m, 2H), 1.50-1.20 (m, 16H), 1.00-0.78 (m, 12H)."

[Synthesis Example of Donor Unit Monomer]

A monomer MD1 given below is synthesized according to a method described in Jiuanhui Hou et al., Macromolecules, 2008, Vol. 41, 6012. A monomer MD2 given below is synthesized according to a method described in Yongye Liang et al., J. Am. Chem. Soc. 2009, Vol. 131, No. 22, 7792-7799.

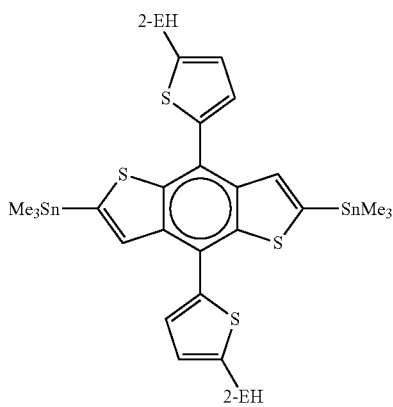

[MD1]

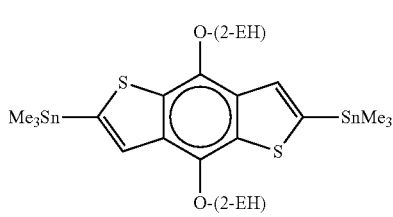

[MD2]

Example 1

A polymer P1 given below is synthesized.

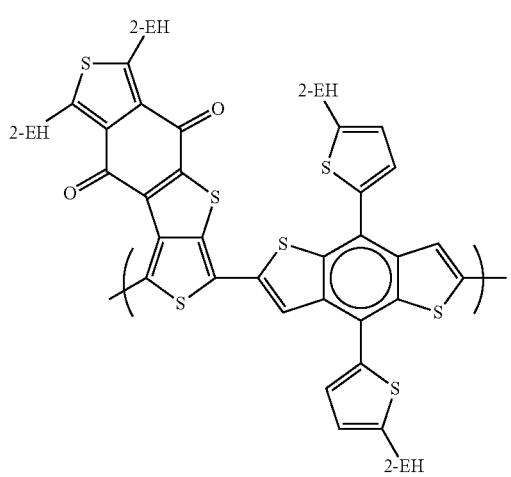

[P1]

Under nitrogen, 0.452 g (0.500 mmol) of the monomer MD1, 0.330 g (0.500 mmol) of the monomer MAa, and 0.024 g of tetrakis(triphenylphosphine)palladium (catalyst) are weighed in a three-neck flask having a three-way cock, and while argon is supplied to the three-neck flask through the three-way cock, a reflux tube with an argon conduit attached thereto is fitted to the three-neck flask while the argon is supplied, and subsequently, a dropping funnel is attached while the entrance of the air is prevented in order to prevent deactivation of the catalyst due to the mixture of the air. The argon conduit is connected to a vacuum line and argon and the vacuum can be switched over. The three-way cock is closed to make the inside of the flask vacuum, and argon is introduced again. This operation is repeated three times.

8 mL of anhydrous toluene deaerated by a syringe and 2 mL of anhydrous DMF are added by opening the three-way cock (argon has been supplied from the one way) attached to the three-neck flask to be dissolved. The three-neck flask is heated by an oil bath to cause a reaction for 12 hours at a reflux temperature and is cooled to room temperature. Under nitrogen, as an end capping agent, 0.066 g of trimethylphenyltin is weighed and is dissolved in 4 ml of deaerated anhydrous toluene, and the resultant is added to the flask by a syringe similarly to the above, and heating reflux is performed for 2 hours. After cooling to room temperature, under nitrogen, as another end capping agent, 0.058 g of bromobenzene is weighed and is dissolved in 4 ml of deaerated anhydrous toluene, and the resultant is added to the flask by a syringe similarly to the above, and heating reflux is performed for 2 hours.

After cooling to room temperature, this reaction solution is dropped into 500 mL of methanol while stirring, and a polymer is settled. This deposit is filtrated by a glass filter and thereafter is dissolved in chloroform, and the catalyst is removed by a celite column. After the solvent is condensed by an evaporator, methanol is further added, and after sufficient stirring, the resultant is filtrated by using a glass filter, and thereby a solid body is obtained. This solid body is vacuum-dried at 80° C. for 4 hours, and thereby a black solid body polymer having a luster is obtained quantitatively. Refining is performed by ethyl acetate, hexane, and toluene in the order mentioned by Soxhlet extraction. Thereafter, a benzene extraction component is used. The yield of the benzene extraction component is 93.7%.

The obtained solid body is evaluated by using a NMR apparatus and there is obtained a result "1H-NMR (270 MHz, CDCl3) ə: 7.9-6.85 (m), 3.4-2.75 (Broad), 1.87~0.6 (m)." In 6.35-7.9 ppm, a peak of an aromatic proton of a benzodithiophene ring and a thiophene ring of a side chain is observed, and in 3.4-2.75 ppm, a peak corresponding to CH$_2$ bonded to the thiophene ring of the side chain is observed, and in 0.6-1.87 ppm, a peak corresponding to an alkyl group is observed, and this compound is confirmed as being an intended polymer. Evaluation by gel permeation chromatography is also conducted. When a polystyrene-converted weight-average molecular weight is measured by using a GPC apparatus (HPCL: CBM20 (trade name) manufactured by Shimadzu Corporation, column: K-504 manufactured by Shodex, solvent: chloroform), it is 16000 (Mw/Mn=2.5). When a UV-vis absorption spectrum is measured (A2000 (trade name) manufactured by Shimadzu Corporation, a chloroform solution is used), the absorption peak (λ) is 350 nm, 450 nm, and 604 nm.

Example 2

A polymer P2 given below is synthesized.

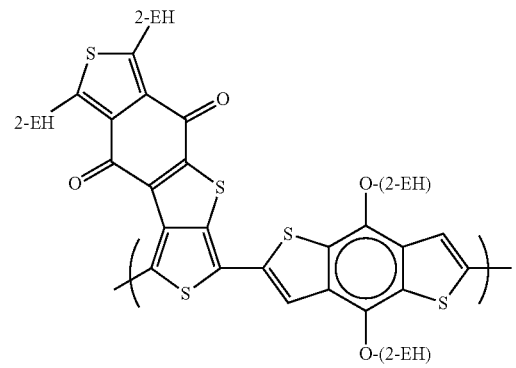

[P2]

A black solid body polymer having a luster is obtained by performing synthesis under the same condition as that of Example 1 except that the monomer MD2 is used in place of the monomer MD1 of Example 1. Refining is performed by ethyl acetate, hexane, toluene, and chlorobenzene in the order mentioned by Soxhlet extraction. Thereafter, a benzene extraction component is used. The yield of the benzene extraction component is 85%.

The obtained solid body is evaluated by using a NMR apparatus and there is obtained a result "1H-NMR (270 MHz, CDCl3) ə: 8.0-6.8 (m), 3.5-2.75 (Broad), 1.9-0.6 (m)." In 6.8-8.0 ppm, a peak of an aromatic proton of a benzodithiophene ring and a thiophene ring of a side chain is observed, and in 2.75-3.5 ppm, a peak corresponding to CH$_2$ bonded to the thiophene ring of the side chain is observed, and in 0.6-1.9 ppm, a peak corresponding to an alkyl group is observed, and this compound is confirmed as being an intended polymer. Further, when a weight-average molecular weight and a UV-vis absorption spectrum are measured by the same methods, the polystyrene-converted weight-average molecular weight is 22000 (Mw/Mn=2.8), and the absorption peak (λ) is 345 nm, 455 nm, and 612 nm.

Example 3

A polymer P3 given below is synthesized.

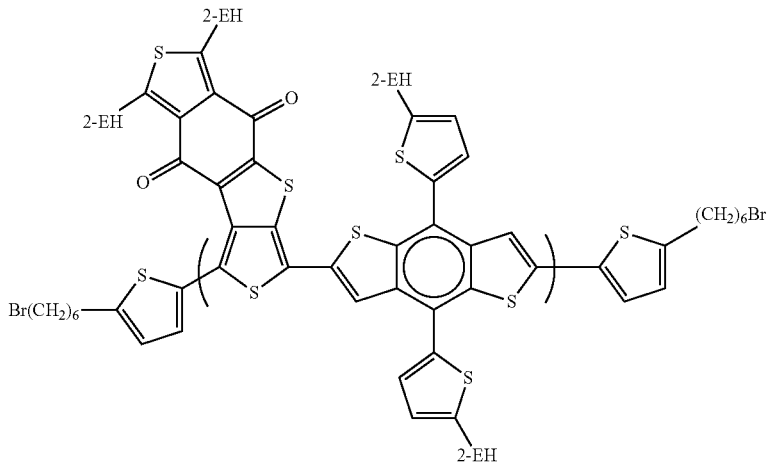

[P3]

A black solid body polymer having a luster is obtained by performing synthesis under the same condition as that of Example 1 except that as an end capping agent, 2-trimethylstannyl-5-(6-bromohexyl)thiophene and 2-bromo-5-(6-bromohexyl)thiophene are used. Refining is performed by ethyl acetate, hexane, toluene, and chlorobenzene in the order mentioned by Soxhlet extraction. Thereafter, a benzene extraction component is used. The yield of the benzene extraction component is 85%.

The obtained solid body is evaluated by using a NMR apparatus and there is obtained a result "1H-NMR (270 MHz, CDCl3) ∂: 7.9-6.8 (m), 3.4-2.7 (Broad), 1.87-0.6 (m)." In 6.8-7.9 ppm, a peak of an aromatic proton of a benzodithiophene ring and a thiophene ring of a side chain is observed, and in 2.7-3.4 ppm, a peak corresponding to CH$_2$ bonded to the thiophene ring of the side chain is observed, and in 0.6-1.87 ppm, a peak corresponding to an alkyl group is observed, and this compound is confirmed as being an intended polymer. Further, when a weight-average molecular weight and a UV-vis absorption spectrum are measured by the same methods as those described above, the polystyrene-converted weight-average molecular weight is 23000 (Mw/Mn=2.6), and the absorption peak (λ) is 349 nm, 450 nm, and 605 nm.

Example 4

A polymer P4 given below is synthesized.

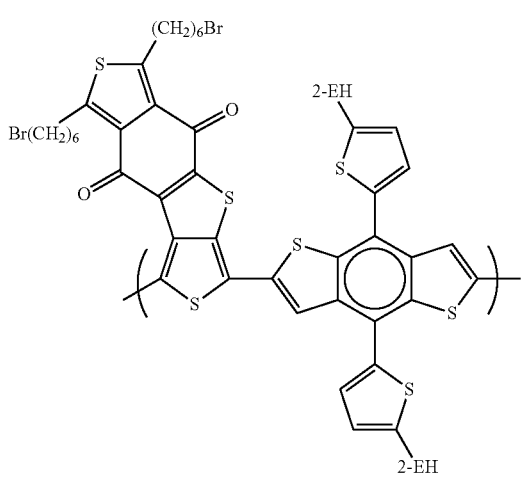

[P4]

A black solid body polymer having a luster is obtained by performing synthesis under the same condition as that of Example 1 except that the monomer MAc is used in place of the monomer MAa of Example 1. Refining is performed by ethyl acetate, hexane, toluene, and chlorobenzene in the order mentioned by Soxhlet extraction. Thereafter, a benzene extraction component is used. The yield of the benzene extraction component is 75%.

The obtained solid body is evaluated by using a NMR apparatus and there is obtained a result "1H-NMR (270 MHz, CDCl3) ∂: 8.2-6.35 (m), 3.9-3.5 (Broad), 3.2-2.6 (Broad), 2.3-0.6 (m)." In 6.35-8.2 ppm, a peak of an aromatic proton of a benzodithiophene ring and a thiophene ring of a side chain is observed, in 3.5-4.1 ppm, a peak corresponding to CH$_2$ bonded to Br is observed, in 2.6-3.2 ppm, a peak corresponding to CH$_2$ bonded to the thiophene ring of the side chain is observed, and in 0.6-2.3 ppm, a peak corresponding to an alkyl group is observed, and this compound is confirmed as being an intended polymer. Further, when a weight-average molecular weight and a UV-vis absorption spectrum are measured by the same methods as those described above, the polystyrene-converted weight-average molecular weight is 25000 (Mw/Mn=2.8), and the absorption peak (k) is 348 nm, 452 nm, and 609 nm.

Example 5

A polymer P5 given below is synthesized.

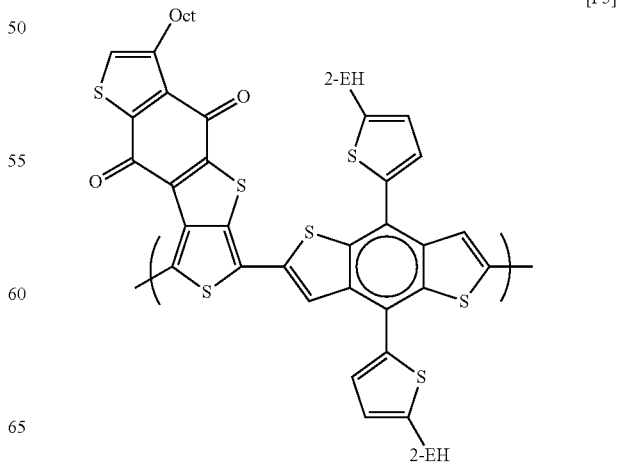

[P5]

A black solid body polymer having a luster is obtained by performing synthesis under the same condition as that of Example 1 except that the monomer MAb is used in place of the monomer MAa of Example 1. Refining is performed by ethyl acetate, hexane, toluene, and chlorobenzene in the order mentioned by Soxhlet extraction. Thereafter, a benzene extraction component is used. The yield of the benzene extraction component is 87%%.

The obtained solid body is evaluated by using a NMR apparatus and there is obtained a result "1H-NMR (270 MHz, CDCl3) ∂: 7.9-6.7 (Broad), 3.9-3.5 (Broad), 3.2-2.6 (Broad), 2.1-0.6 (m)." In 6.7-7.9 ppm, a peak of an aromatic proton of a benzodithiophene ring and a thiophene ring of a side chain is observed, in 3.5-3.9 ppm, a peak corresponding to $CH_2$ bonded to Br is observed, in 2.6-3.2 ppm, a peak corresponding to $CH_2$ bonded to the thiophene ring of the side chain is observed, and in 0.6-2.1 ppm, a peak corresponding to an alkyl group is observed, and this compound is confirmed as being an intended polymer. Further, when a weight-average molecular weight and a UV-vis absorption spectrum are measured by the same methods as those described above, the polystyrene-converted weight-average molecular weight is 25000 (Mw/Mn=2.7), and the absorption peak (k) is 348 nm, 449 nm, and 611 nm.

Example 6

A polymer P6 given below is synthesized.

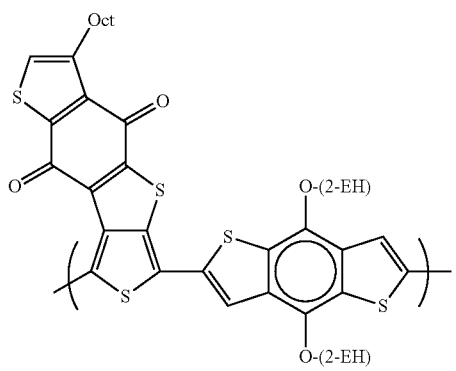

[P6]

A black solid body polymer having a luster is obtained by performing synthesis under the same condition as that of Example 5 except that the monomer MD2 is used in place of the monomer MD1 of Example 5. Refining is performed by ethyl acetate, hexane, toluene, and chlorobenzene in the order mentioned by Soxhlet extraction. Thereafter, a benzene extraction component is used. The yield of the benzene extraction component is 82%.

The obtained solid body is evaluated by using a NMR apparatus and there is obtained a result "1H-NMR (270 MHz, CDCl3) ∂: 8.2-6.5 (Broad), 4.4-3.7 (Broad), 3.2-2.6 (Broad), 2.2-0.6 (m)." In 6.5-8.2 ppm, a peak of an aromatic proton of a benzodithiophene ring and a thiophene ring of a side chain is observed, in 3.7-4.4 ppm, a peak corresponding to $CH_2$ bonded to oxygen is observed, in 2.6-3.2 ppm, a peak corresponding to $CH_2$ bonded to the thiophene ring of the side chain is observed, and in 0.6-2.2 ppm, a peak corresponding to an alkyl group is observed, and this compound is confirmed as being an intended polymer. Further, when a weight-average molecular weight and a UV-vis absorption spectrum are measured by the same methods as those described above, the polystyrene-converted weight-average molecular weight is 38000 (Mw/Mn=2.4), and the absorption peak (k) is 348 nm, 461 nm, and 615 nm.

Example 7

A polymer P7 given below is synthesized.

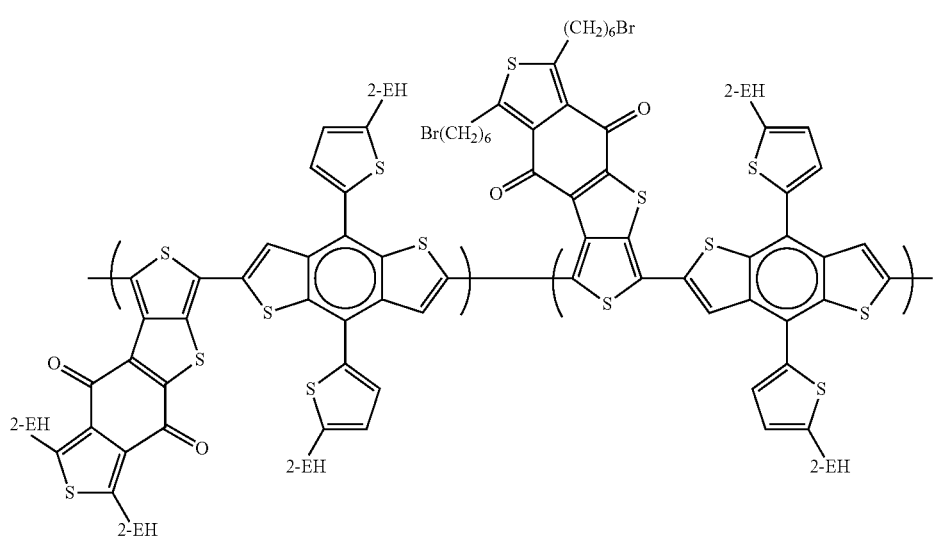

[P7]

A black solid body polymer having a luster is obtained by performing synthesis under the same condition as that of Example 1 except that a mixture of the monomer MAa and the monomer MAc (MAa:MAc=4:1 (molar ratio)) is used in place of the monomer MAa of Example 1. Refining is performed by ethyl acetate, hexane, toluene, and chlorobenzene in the order mentioned by Soxhlet extraction. Thereafter, a benzene extraction component is used. The yield of the benzene extraction component is 75%.

The obtained solid body is evaluated by using a NMR apparatus and there is obtained a result "1H-NMR (270 MHz, CDCl3) ∂: 8.0-6.5 (Broad), 3.9-3.5 (Broad), 3.3-2.6 (Broad), 2.3-0.6 (m)." In 6.5-8.0 ppm, a peak of an aromatic proton of a benzodithiophene ring and a thiophene ring of a side chain is observed, in 3.5-3.9 ppm, a peak corresponding to $CH_2$ bonded to Br is observed, in 2.6-3.3 ppm, a peak corresponding to $CH_2$ bonded to the thiophene ring of the side chain is observed, and in 0.6-2.3 ppm, a peak corresponding to an alkyl group is observed, and this compound is confirmed as being an intended polymer. Further, when a weight-average molecular weight and a UV-vis absorption spectrum are measured by the same methods as those described above, the polystyrene-converted weight-average molecular weight is 29000 (Mw/Mn=3.2), and the absorption peak (k) is 347 nm, 452 nm, and 607 nm.

Fabrication of Organic Thin-Film Solar Cell Element

Examples 8 to 14

The polymers (P1 to P7) of Examples 1 to 7 being the p-type semiconductor materials are mixed with PC70BM being the n-type semiconductor material in a manner that each mass ratio to PC70BM becomes 1:2. Next, the mixtures are dissolved in chlorobenzene in a nitrogen atmosphere so that each concentration of the mixtures becomes 2.0 mass %. 1,8-diiodooctane is added so that its ratio becomes 3 mass % of each of the whole solutions, and the resultant solutions are stirred and mixed at a 120° C. temperature for 1 hour by using a hot stirrer. After the solutions having been stirred and mixed are cooled to room temperature, the solutions are filtrated by a 0.20 μm polytetrafluoroethylene (PTFE) filter, and thereby active layer coating solutions using the respective polymers are obtained.

Glass substrates whose transparent conductive films of indium-tin oxide (ITO) are patterned are cleaned by ultrasonic cleaning by a surface-active agent, water washing by ultrapure water, and ultrasonic cleaning by ultrapure water in the order mentioned, and thereafter are dried by nitrogen blowing, and are dried by five-minute heating at 120° C. in the atmosphere. Finally, the substrates are cleaned by ultraviolet ozone. Each of the substrates is spin-coated with a diethoxyethane solution of diethyl zinc being the precursor of a zinc oxide (2%, manufactured by Showa Denko K.K.) as an electron extraction layer in a nitrogen atmosphere, and the coated substrates are heated for 10 minutes on a 150° C. hot plate in the atmosphere. The film thickness of the electron extraction layer is about 20 nm.

The substrates on each of which the electron extraction layer is formed are spin-coated with the respective active layer coating solutions of the polymers at a 600 rpm speed under a nitrogen atmosphere, and thereby active layers with an about 90 nm thickness are formed. Thereafter, a vanadium oxide film having an average film thickness of 2 nm as a hole extraction layer and further silver with a 100 nm thickness as an electrode layer are sequentially formed by a vacuum vapor deposition method of a resistance heating type. In this manner, 1 cm square solar cell elements are fabricated.

Examples 15 to 17

Substrates on each of which an electron extraction layer is formed in the same manner as in Example 8 are spin-coated with respective active layer coating solutions of the polymer [P3] of Example 3, the polymer [P4] of Example 4, and the polymer [P7] of Example 7 respectively at a 600 rpm speed under a nitrogen atmosphere, and thereby active layers with an about 90 nm thickness are formed. Next, under an argon atmosphere, UV light (254 nm, 1.9 $mW/cm^2$) is radiated for 30 minutes for photocrosslinking. Thereafter, a hole extraction layer and an electrode layer are formed in the same manner as in Example 8, and 1 cm square solar cell elements are fabricated. [Evaluation of Organic Thin-Film Solar Cell Element]

A 1 cm square metal mask is put on each of the fabricated solar cell elements, and by using, as a radiation light source, a SPECTR solar simulator IVP0605 (trade name) manufactured by Asahi Spectra Co., Ltd. whose air mass (AM) is 1.5 G and whose irradiance is 100 $mW/cm^2$, a current-voltage characteristic between an ITO electrode and an Ag electrode is measured. Table 1 presents, as measurement results, open-circuit voltage (Voc), short-circuit current density (Jsc), fill factor (FF), and conversion efficiency.

TABLE 1

| | | Evaluation result of characteristic of organic thin-film solar cell | | | |
|---|---|---|---|---|---|
| | Polymer | Open-circuit voltage (Voc) [V] | Short-circuit current density (Jsc) [$mA/cm^2$] | Fill factor (FF) | Power generation efficiency [%] |
| Example 8 | Example 1 [P1] | 1.03 | 3.1 | 0.56 | 1.79 |
| Example 9 | Example 2 [P2] | 0.98 | 2.8 | 0.54 | 1.48 |
| Example 10 | Example 3 [P3] | 1.01 | 3.0 | 0.55 | 1.67 |
| Example 11 | Example 4 [P4] | 1.05 | 2.7 | 0.50 | 1.42 |
| Example 12 | Example 5 [P5] | 0.99 | 3.5 | 0.55 | 1.91 |
| Example 13 | Example 6 [P6] | 0.97 | 3.1 | 0.51 | 1.53 |
| Example 14 | Example 7 [P7] | 1.00 | 2.8 | 0.52 | 1.46 |
| Example 15 | Example 3 [P3] + Photocrosslinking | 1.00 | 2.5 | 0.51 | 1.28 |
| Example 16 | Example 4 [P4] + Photocrosslinking | 1.01 | 2.3 | 0.50 | 1.16 |
| Example 17 | Example 7 [P7] + Photocrosslinking | 0.99 | 2.6 | 0.50 | 1.29 |

As is apparent from Table 1, it is seen that the solar cell elements using the polymers of Examples are high in the open-circuit voltage (Voc). Accordingly, by using the polymers of Examples, it becomes possible to provide a high-performance organic thin-film solar cell. Further, the solar cell element in which the polymer is subjected to the photocrosslinking and the solar cell element in which the polymer is not subjected to the photocrosslinking are heated at 100° C. for 30 minutes in a nitrogen atmosphere, and thereafter their characteristics are measured in the same manner. As a result, it is confirmed that the solar cell element in which the polymer is subjected to the photocrosslinking has a small deterioration ratio of the characteristics before and after the light radiation. It is possible to improve light resistance and heat resistance by cross-linking the polymer.

Fabrication of Organic/Inorganic Hybrid Solar Cell Element

Examples 18 to 24

Lead iodide ($PbI_2$) and methylammonium iodide ($CH_3NH_4I$) are mixed at a molar ratio of 1:1, and this mixture is dissolved in dimethylformamide in a nitrogen atmosphere so that its concentration becomes 40 mass %. This resultant solution is stirred and mixed at a 120° C. temperature for 1 hour by using a hot stirrer. After the solution having been stirred and mixed is cooled to room temperature, the solution is filtrated by a 0.45 μm polytetrafluoroethylene (PTFE) filter, and thereby an active layer coating solution is obtained.

The polymers of Examples 1 to 7 (P1 to P7) being the p-type semiconductor materials are dissolved in chlorobenzene in a nitrogen atmosphere so that each concentration of the polymers becomes 1.0 mass %. These solutions are stirred and mixed at a 120° C. temperature for 1 hour by using a hot stirrer. After the solutions having been stirred and mixed are cooled to room temperature, the solutions are filtrated by a 0.20 μm PTFE filter, and thereby hole extraction layer coating solutions using the respective polymers are obtained.

Glass substrates whose transparent conductive films of fluorine-doped tin oxide (FTO) are patterned are cleaned by ultrasonic cleaning by a surface-active agent, water washing by ultrapure water, and ultrasonic cleaning by ultrapure water in the order mentioned, and thereafter are dried by nitrogen blowing, and are dried by five-minute heating at 120° C. in the atmosphere. Finally, the substrates are cleaned by ultraviolet ozone. Each of the substrates is spin-coated with an ethanol solution of titanium diisopropoxidebis (acetylacetone), and the coated substrates are heated for 30 minutes at 450° C. to then be cooled. These substrates are immersed in a titanium chloride ($TiCl_4$) aqueous solution for 30 minutes at 70° C. The substrates taken out from the aqueous solution are cleaned and dried, and then are heated at 500° C. for 20 minutes in the air, and thereby electron extraction layers with an about 20 nm thickness are formed.

The substrates on each of which the electron extraction layer is formed are spin-coated with an active layer coating solution of a perovskite compound at a 600 rpm speed under a nitrogen atmosphere and are dried at 60° C. for about 30 minutes, and thereby active layers with an about 300 nm thickness are formed. The active layers are spin-coated with the hole extraction layer coating solutions of the polymers respectively at a 2000 rpm speed for 60 seconds, and thereby hole extraction layers are formed. Thereafter, gold with a 100 nm thickness as an electrode layer is formed by a vacuum vapor deposition method of a resistance heating type. In this manner, 1 cm square organic/inorganic hybrid solar cell elements are fabricated.

Examples 25 to 27

Substrates on each of which an active layer is formed in the same manner as in Example 18 are spin-coated with respective hole extraction layer coating solutions of the polymer [P3] of Example 3, the polymer [P4] of Example 4, and the polymer [P7] of Example 7 respectively at a 2000 rpm speed for 60 seconds under a nitrogen atmosphere, and thereby hole extraction layers are formed. Next, under an argon atmosphere, UV light (254 nm, 1.9 mW/cm$^2$) is radiated for 30 minutes for photocrosslinking. Thereafter, an electrode layer is formed in the same manner as in Example 18, and 1 cm square solar cell elements are fabricated.

Comparative Example 1

An organic/inorganic hybrid solar cell element is fabricated in the same manner as in Example 18 except that as a forming material of the hole extraction layer, poly(3-hexylthiophene-2,5-diyl) (P3HT) is used.

Comparative Example 2

An organic/inorganic hybrid solar cell element is fabricated in the same manner as in Example 18 except that the hole extraction layer is formed as follows. 180 mg of 2,2',7,7'-tetrakis(N,N-di-p-methoxyphenylamine)-9,9'-bifluorene(spiro-OMeTAD) is dissolved in 1 mL of dichlorobenzene. Into this resultant solution, 37.5 μL of a solution obtained by dissolving 170 mg of lithium bis(trifluoromethanesulfonyl)imide (Li-TFSI) in 1 mL of acetonitrile is added, and further, 17.5 μL of 4-t-butylpyridine is added, and thereby a hole extraction layer coating solution is fabricated. Spin-coating is performed with this hole extraction layer coating solution at a 3000 rpm speed for 30 seconds, and thereby a hole extraction layer is formed.

[Evaluation of Organic/Inorganic Hybrid Solar Cell Element]

A 1 cm square metal mask is put on each of the organic/inorganic hybrid solar cell elements, and by using, as a radiation light source, a SPECTR solar simulator IVP0605 (trade name) manufactured by Asahi Spectra Co., Ltd. whose air mass (AM) is 1.5 G and whose irradiance is 100 mW/cm$^2$, a current-voltage characteristic between an FTO electrode and an Au electrode is measured. Table 2 presents, as measurement results, open-circuit voltage (Voc), short-circuit current density (Jsc), fill factor (FF), and conversion efficiency. Further, the organic/inorganic hybrid solar cell elements are each encapsulated by a glass to be heated at 90° C. for 15 minutes on a hot plate in a nitrogen atmosphere, and then are cooled down to room temperature. The same characteristics are measured after the heating test to find deterioration ratios. Table 2 presents deterioration ratio of the characteristics before and after the heating.

TABLE 2

Evaluation result of characteristic of organic/inorganic hybrid solar cell

| | Polymer | Open-circuit voltage (Voc) [V] | Short-circuit current density(Jsc) [mA/cm$^2$] | Fill factor (FF) | Power generation efficiency [%] | Deterioration ratio of heat-resistance test [%] |
|---|---|---|---|---|---|---|
| Example 18 | Example 1 [P1] | 0.80 | 12.3 | 0.57 | 5.61 | 5 |
| Example 19 | Example 2 [P2] | 0.78 | 11.9 | 0.54 | 5.01 | 4 |
| Example 20 | Example 3 [P3] | 0.79 | 11.9 | 0.55 | 5.17 | 5 |
| Example 21 | Example 4 [P4] | 0.81 | 12.5 | 0.53 | 5.37 | 6 |
| Example 22 | Example 5 [P5] | 0.83 | 12.7 | 0.55 | 5.80 | 3 |
| Example 23 | Example 6 [P6] | 0.79 | 11.7 | 0.56 | 5.18 | 3 |
| Example 24 | Example 7 [P7] | 0.79 | 11.8 | 0.55 | 5.13 | 4 |
| Example 25 | Example 3 [P3] + Photocrosslinking | 0.77 | 10.5 | 0.54 | 4.37 | 4 |
| Example 26 | Example 4 [P4] + Photocrosslinking | 0.75 | 10.8 | 0.53 | 4.29 | 5 |
| Example 27 | Example 7 [P7] + Photocrosslinking | 0.78 | 11.6 | 0.52 | 4.70 | 3 |
| Comparative Example 1 | P3HT | 0.50 | 10.5 | 0.65 | 3.41 | 4 |
| Comparative Example 2 | Spiro-OMeTAD + Li-TFSI | 0.93 | 18.3 | 0.64 | 10.89 | 75 |

As is apparent from Table 2, it is seen that the organic/inorganic hybrid solar cell elements using the polymers of Examples are excellent in conversion efficiency (power generation efficiency) and heat resistance. Accordingly, by using the polymers of Examples, it becomes possible to provide a high-performance and longer lasting organic/inorganic hybrid solar cell.

While certain embodiments have been described, these embodiments have been presented by way of example only, and are not intended to limit the scope of the inventions. These novel embodiments may be embodied in a variety of other forms, and various omissions, substitutions and changes may be made without departing from the spirit of the inventions. These embodiments or modifications thereof are included in the scope and spirit of the inventions and included in the inventions described in the claims and their equivalents.

What is claimed is:

1. A polymer comprising a recurring unit containing at least one selected from a bivalent group represented by the following formula (1), a bivalent group represented by the following formula (2), a bivalent group represented by the following formula (3), or a bivalent group represented by the following formula (4)

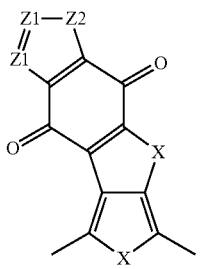

(1)

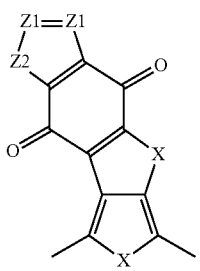

(2)

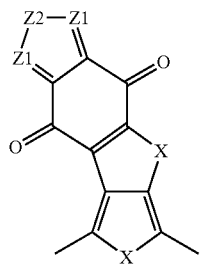

(3)

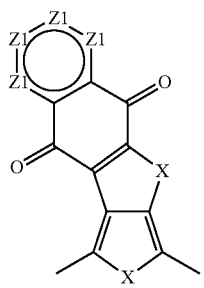

(4)

wherein Z1 indicates one selected from carbon having an R1 group or nitrogen, Z2 indicates one selected from oxygen, sulfur, selenium, nitrogen having an R2 group, or a sulfinyl group, the R1 group indicates a monovalent group selected from hydrogen, halogen, a cyano group, a nitro group, a substituted or unsubstituted alkyl group, a substituted or unsubstituted alkoxy group, a substituted or unsubstituted alkanoyl group, a substituted or unsubstituted alkylsulfanyl group, a substituted or unsubstituted aryl group, or a substituted or unsubstituted heteroaryl group, the R2 group indicates a monovalent group selected from hydrogen, a substituted or unsubstituted alkyl group, a substituted or unsubstituted alkanoyl group, a substituted or unsubstituted aryl group, or a substituted or unsubstituted heteroaryl group, and X indicates one selected from oxygen, sulfur, or selenium.

2. The polymer of claim 1, comprising at least one selected from among a recurring unit represented by the formula (1), a recurring unit represented by the formula (2), a recurring unit represented by the formula (3), and a recurring unit represented by the formula (4).

3. The polymer of claim 2, further comprising a cross-linking group as an end group.

4. The polymer of claim 1, comprising at least one selected from a recurring unit represented by the following formula (5), a recurring unit represented by the following formula (6), a recurring unit represented by the following formula (7), or a recurring unit represented by the following formula (8).

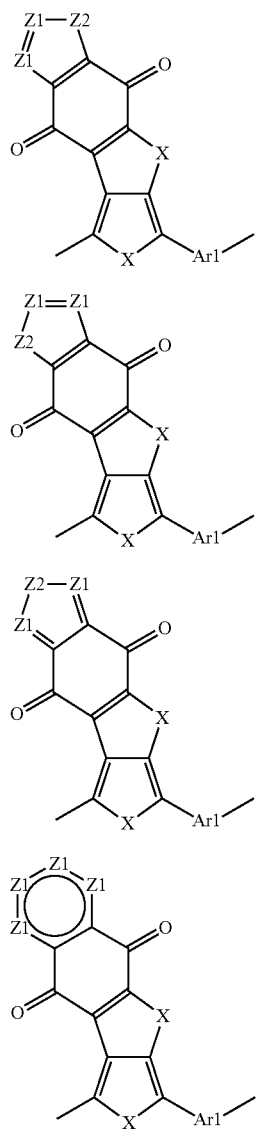

wherein Z1 indicates one selected from carbon having an R1 group or nitrogen, Z2 indicates one selected from oxygen, sulfur, selenium, nitrogen having an R2 group, or a sulfinyl group, the R1 group indicates a monovalent group selected from hydrogen, halogen, a cyano group, a nitro group, a substituted or unsubstituted alkyl group, a substituted or unsubstituted alkoxy group, a substituted or unsubstituted alkanoyl group, a substituted or unsubstituted alkylsulfanyl group, a substituted or unsubstituted aryl group, or a substituted or unsubstituted heteroaryl group, the R2 group indicates a monovalent group selected from hydrogen, a substituted or unsubstituted alkyl group, a substituted or unsubstituted alkanoyl group, a substituted or unsubstituted aryl group, or d a substituted or unsubstituted heteroaryl group, X indicates one selected from among oxygen, sulfur, or selenium, and Ar1 indicates a divalent conjugated group.

5. The polymer of claim 4, further comprising a cross-linking group as an end group.

6. The polymer of claim 1, comprising at least one selected from a recurring unit represented by the following formula (9), a recurring unit represented by the following formula (10), a recurring unit represented by the following formula (11), or a recurring unit represented by the following formula (12).

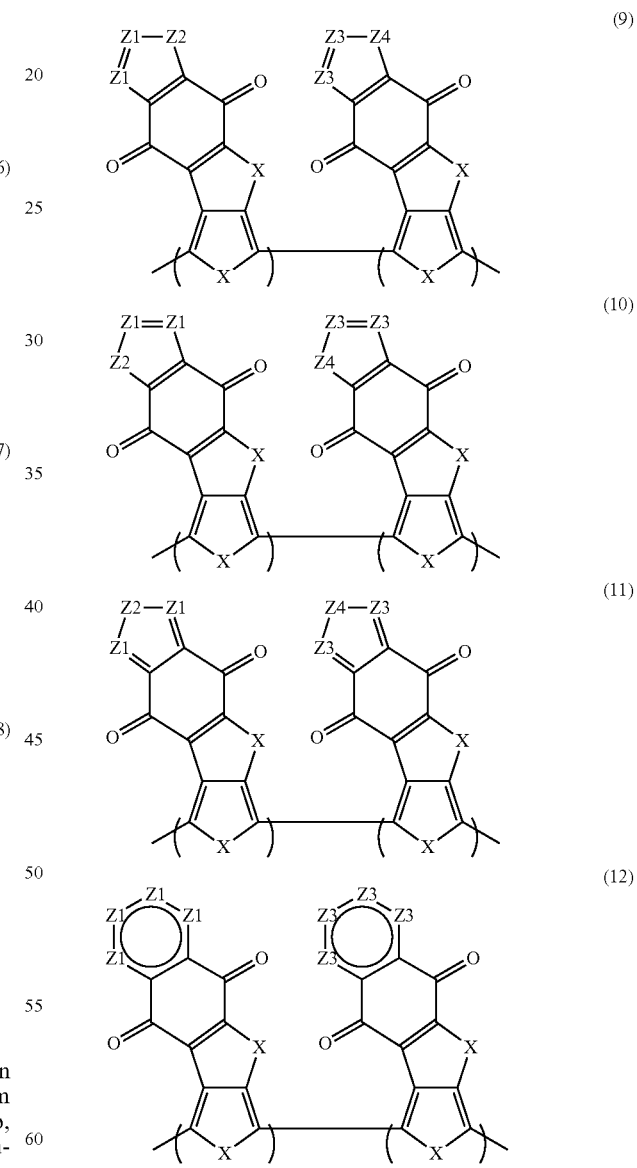

wherein at least one selected from Z3 or Z4 has a cross-linking group, Z1 and Z3 without having a cross-linking group independently indicate one selected from carbon having an R1 group or nitrogen, Z2 and Z4 without having a cross-linking group independently indicate one selected from oxygen, sulfur, selenium, nitrogen having an R2 group, or a sulfinyl group, the R1 group indicates a monovalent group selected from hydrogen, halogen, a cyano group, a nitro group, a substituted or unsubstituted alkyl group, a substituted or unsubstituted alkoxy group, a substituted or unsubstituted alkanoyl group, a substituted or unsubstituted alkylsulfanyl group, a substituted or unsubstituted aryl group, or a substituted or unsubstituted heteroaryl group, the R2 group indicates a monovalent group selected from hydrogen, a substituted or unsubstituted alkyl group, a substituted or unsubstituted alkanoyl group, a substituted or unsubstituted aryl group, or a substituted or unsubstituted heteroaryl group, and X indicates one selected from oxygen, sulfur, or selenium.

7. The polymer of claim 1, comprising at least one selected from a recurring unit represented by the following formula (13), a recurring unit represented by the following formula (14), a recurring unit represented by the following formula (15), or a recurring unit represented by the following formula (16)

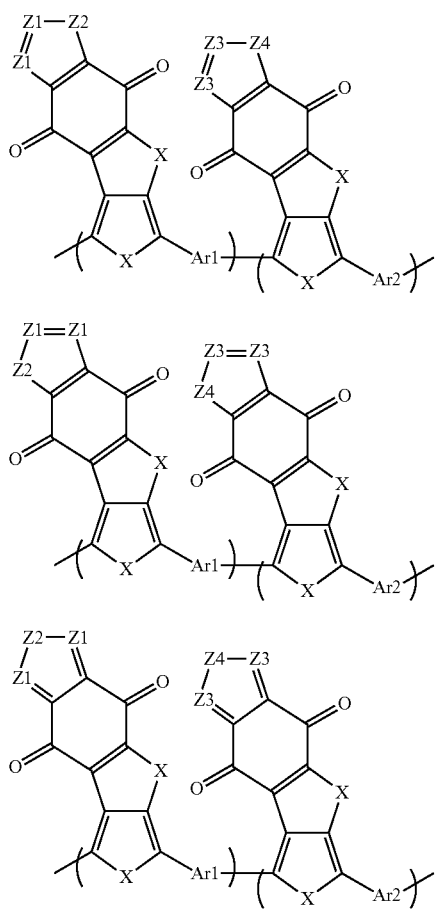

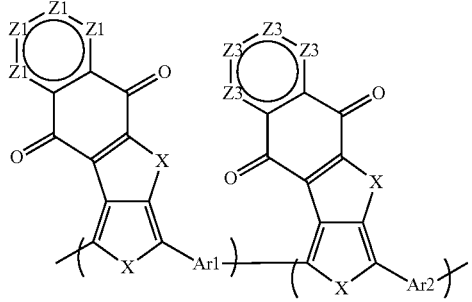

wherein at least one selected from Z3, Z4, or Ar2 has a cross-linking group, Z1 and Z3 without having a cross-linking group independently indicate one selected from carbon having an R1 group or nitrogen, Z2 and Z4 without having a cross-linking group independently indicate one selected from oxygen, sulfur, selenium, nitrogen having an R2 group, or an alkylsulfinyl group, the R1 group indicates a monovalent group selected from hydrogen, halogen, a cyano group, a nitro group, a substituted or unsubstituted alkyl group, a substituted or unsubstituted alkoxy group, a substituted or unsubstituted alkanoyl group, a substituted or unsubstituted alkylsulfanyl group, a substituted or unsubstituted aryl group, or a substituted or unsubstituted heteroaryl group, the R2 group indicates a monovalent group selected from hydrogen, a substituted or unsubstituted alkyl group, a substituted or unsubstituted alkanoyl group, a substituted or unsubstituted aryl group, or a substituted or unsubstituted heteroaryl group, X indicates one selected from oxygen, sulfur, or selenium, and Ar1 and Ar2 without having a cross-linking group indicate a divalent conjugated group.

8. A solar cell comprising the polymer of claim 1.

9. A solar cell comprising:
a first electrode;
a second electrode; and
a photoelectric conversion layer disposed between the first electrode and the second electrode and containing an organic material,
wherein the organic material contains the polymer of claim 1.

10. The solar cell of claim 9,
wherein the photoelectric conversion layer includes an active layer containing the polymer.

11. The solar cell of claim 9,
wherein the photoelectric conversion layer includes a buffer layer containing the polymer.

* * * * *